(12) United States Patent
Ohnuma

(10) Patent No.: US 7,151,017 B2
(45) Date of Patent: Dec. 19, 2006

(54) METHOD OF MANUFACTURING SEMICONDUCTOR DEVICE

(75) Inventor: Hideto Ohnuma, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/053,572

(22) Filed: Jan. 24, 2002

(65) Prior Publication Data

US 2002/0142525 A1 Oct. 3, 2002

(30) Foreign Application Priority Data

Jan. 26, 2001 (JP) .............................. 2001-019293

(51) Int. Cl.
*H01L 21/00* (2006.01)
(52) U.S. Cl. ...................................... 438/151
(58) Field of Classification Search ......... 438/149–166
See application file for complete search history.

(56) References Cited

U.S. PATENT DOCUMENTS

| | | |
|---|---|---|
| 3,891,468 A | 6/1975 | Ito et al. |
| 4,168,990 A | 9/1979 | Lenie et al. |
| 4,169,740 A | 10/1979 | Kalbitzer et al. |
| 4,199,773 A | 4/1980 | Goodman et al. |
| 4,463,492 A | 8/1984 | Maeguchi |
| 4,472,871 A | 9/1984 | Green et al. |
| 4,727,044 A | 2/1988 | Yamazaki |
| 4,775,641 A | 10/1988 | Duffy et al. |
| 4,959,700 A | 9/1990 | Yamazaki |
| 5,064,775 A | 11/1991 | Chang |
| 5,104,818 A | 4/1992 | Silver |
| 5,111,266 A | 5/1992 | Furumura et al. |
| 5,132,754 A | 7/1992 | Serikawa et al. |

(Continued)

FOREIGN PATENT DOCUMENTS

JP 64-007559 1/1989

(Continued)

OTHER PUBLICATIONS

Y. Mishima et al., *Implantation Temperature Effect on Polycrystalline Silicon By Ion Shower Doping*, Journal of Applied Physics, vol. 74, No. 12, Dec. 15, 1993, pp. 7114-7117.

(Continued)

*Primary Examiner*—Scott B. Geyer
(74) *Attorney, Agent, or Firm*—Eric J. Robinson; Robinson Intellectual Property Law Office, P.C.

(57) ABSTRACT

In a step of doping a silicon-based semiconductor film as a TFT active layer such as channel doping or the like, a protective film is formed by a CVD method as a pretreatment so as to prevent the silicon-based semiconductor film from being contaminated and etched. However, in the case of using the protective film formed by the CVD method, the problems in terms of throughput and production cost (an expensive apparatus is required) have been pointed out. The present invention is intended to solve the above-mentioned problems. Instead of the CVD method, a step of forming a chemical oxide film on a silicon-based semiconductor film is introduced as the pretreatment in the step of doping the silicon-based semiconductor film. Alternatively, a step is introduced in which unsaturated bonds present at the surface of the silicon-based semiconductor film are made to terminate with an element (for instance, oxygen) to be bonded with bonding energy higher than that of Si—H bonds. The above-mentioned pretreatment step can prevent the silicon-based semiconductor film from being etched by hydrogen ions used in the doping step.

38 Claims, 13 Drawing Sheets

U.S. PATENT DOCUMENTS

| | | |
|---|---|---|
| 5,142,344 A | 8/1992 | Yamazaki |
| 5,154,946 A | 10/1992 | Zdebel |
| 5,244,820 A | 9/1993 | Kamata et al. |
| 5,247,190 A | 9/1993 | Friend et al. |
| 5,270,224 A | 12/1993 | Furumura et al. |
| 5,313,077 A | 5/1994 | Yamazaki |
| 5,315,132 A | 5/1994 | Yamazaki |
| 5,396,084 A | 3/1995 | Matsumoto |
| 5,399,502 A | 3/1995 | Friend et al. |
| 5,403,762 A | 4/1995 | Takemura |
| 5,485,019 A | 1/1996 | Yamazaki et al. |
| 5,486,774 A | 1/1996 | Douseki et al. |
| 5,488,000 A | 1/1996 | Zhang et al. |
| 5,501,989 A | 3/1996 | Takayama et al. |
| 5,514,879 A | 5/1996 | Yamazaki |
| 5,518,937 A | 5/1996 | Furumura et al. |
| 5,532,175 A | 7/1996 | Racanelli et al. |
| 5,543,636 A | 8/1996 | Yamazaki |
| 5,565,690 A | 10/1996 | Theodore et al. |
| 5,581,092 A | 12/1996 | Takemura |
| 5,583,369 A | 12/1996 | Yamazaki et al. |
| 5,594,371 A | 1/1997 | Douseki |
| 5,614,732 A | 3/1997 | Yamazaki |
| 5,643,826 A | 7/1997 | Ohtani et al. |
| 5,648,277 A | 7/1997 | Zhang et al. |
| 5,672,541 A | 9/1997 | Booske et al. |
| 5,700,333 A * | 12/1997 | Yamazaki et al. .......... 136/258 |
| 5,773,847 A * | 6/1998 | Hayakawa ................... 257/66 |
| 5,804,471 A | 9/1998 | Yamazaki et al. |
| 5,854,096 A * | 12/1998 | Ohtani et al. ............... 438/166 |
| 5,859,445 A | 1/1999 | Yamazaki |
| 5,904,509 A | 5/1999 | Zhang et al. |
| 5,914,498 A | 6/1999 | Suzawa et al. |
| 5,923,962 A | 7/1999 | Ohtani et al. |
| 5,942,768 A * | 8/1999 | Zhang ......................... 257/72 |
| 5,966,596 A * | 10/1999 | Ohtani et al. ............... 438/155 |
| 5,981,974 A | 11/1999 | Makita |
| 6,011,277 A | 1/2000 | Yamazaki |
| 6,013,930 A | 1/2000 | Yamazaki et al. |
| 6,165,876 A | 12/2000 | Yamazaki et al. |
| 6,218,219 B1 | 4/2001 | Yamazaki et al. |
| 6,228,751 B1 | 5/2001 | Yamazaki et al. |
| 6,235,563 B1 | 5/2001 | Oka et al. |
| 6,258,638 B1 | 7/2001 | Tanabe et al. |
| 6,261,936 B1 * | 7/2001 | Wright et al. ............... 438/595 |
| 6,271,101 B1 | 8/2001 | Fukunaga |
| 6,274,887 B1 | 8/2001 | Yamazaki et al. |
| 6,353,244 B1 | 3/2002 | Yamazaki et al. |
| 6,455,360 B1 | 9/2002 | Miyasaka |
| 6,633,597 B1 | 10/2003 | Abe |
| 2001/0034089 A1 | 10/2001 | Yamazaki et al. |
| 2002/0098635 A1 * | 7/2002 | Zhang et al. ............... 438/199 |

FOREIGN PATENT DOCUMENTS

| | | |
|---|---|---|
| JP | 03-189626 | 8/1991 |
| JP | 04-290467 | 10/1992 |
| JP | 04-302147 | 10/1992 |
| JP | 05-082552 | 4/1993 |
| JP | 10-302707 | 11/1998 |
| JP | 11-307781 | 11/1999 |

OTHER PUBLICATIONS

S. Wolf, et al., Silicon Processing for the VLSI Era, vol. 1, Jan. 1, 1986, pp. 175-180, 323-325.

H. Schenk, et al., *Polymers for Light Emitting Diodes*, Proceedings of the 19th International Display Research Conference, Sep. 6, 1999, pp. 33-37.

* cited by examiner

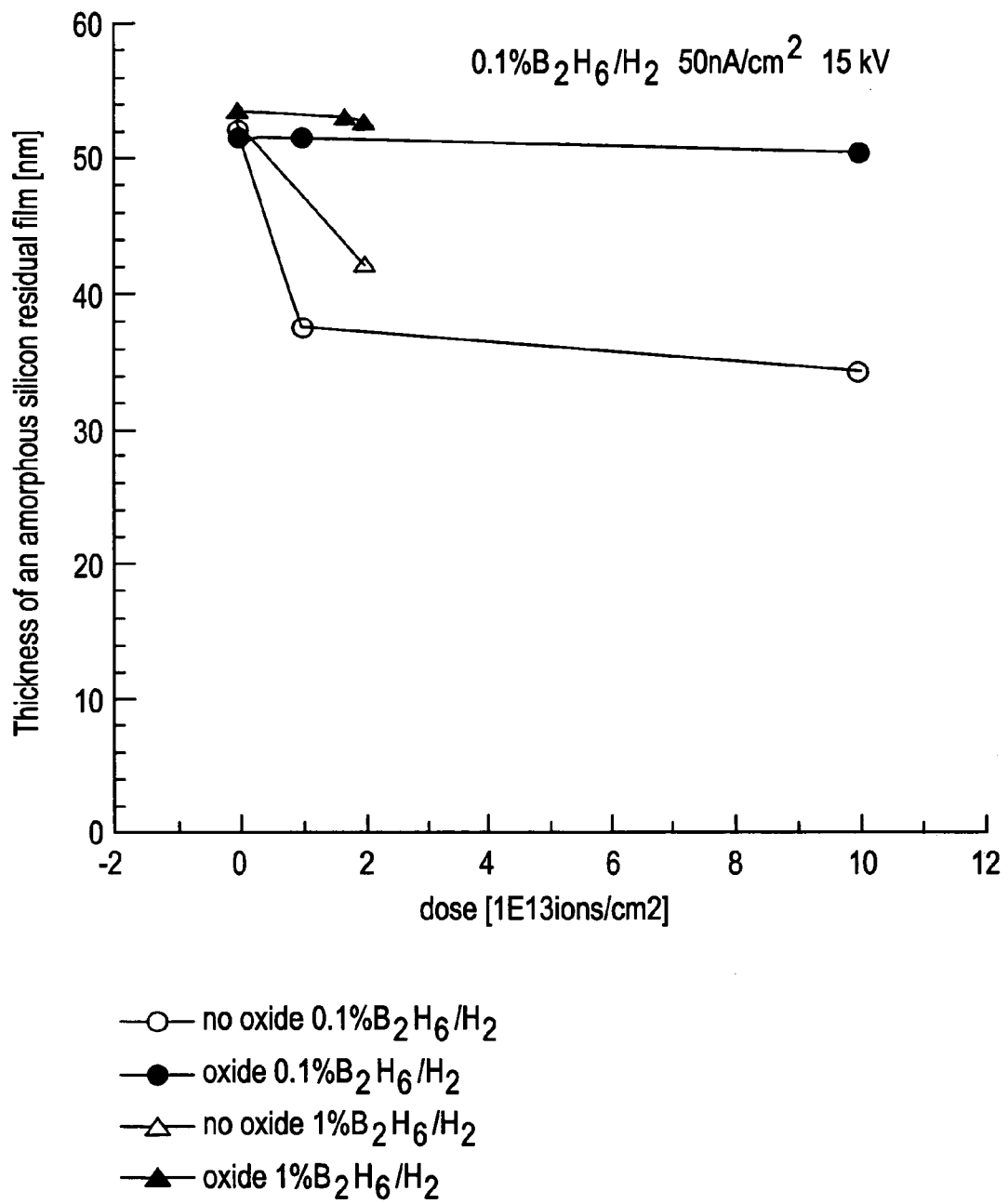

Fib. 4C 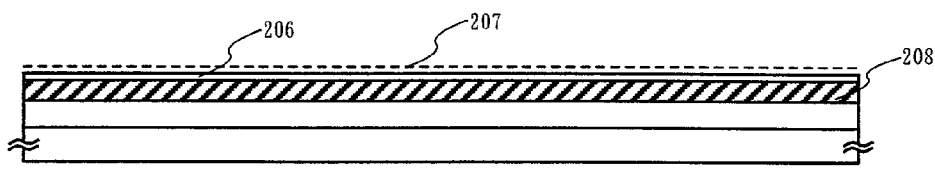

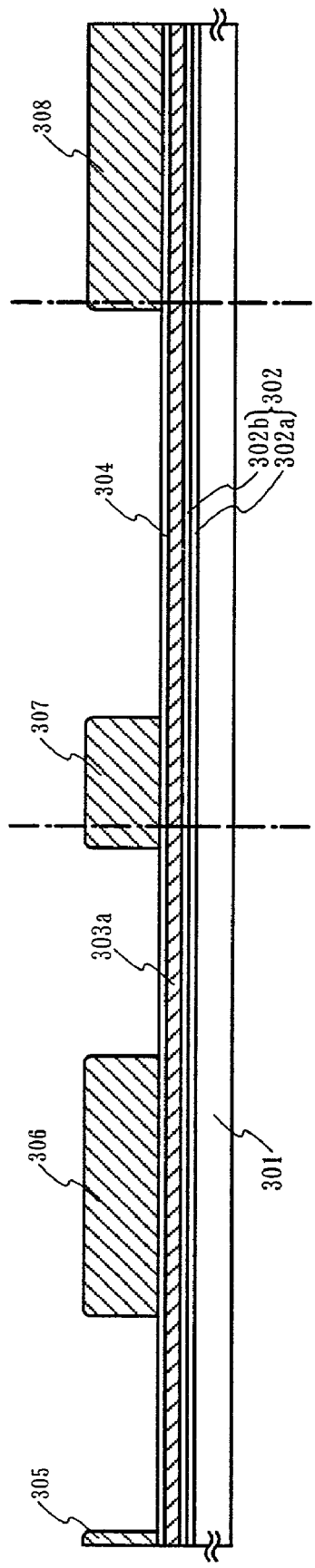
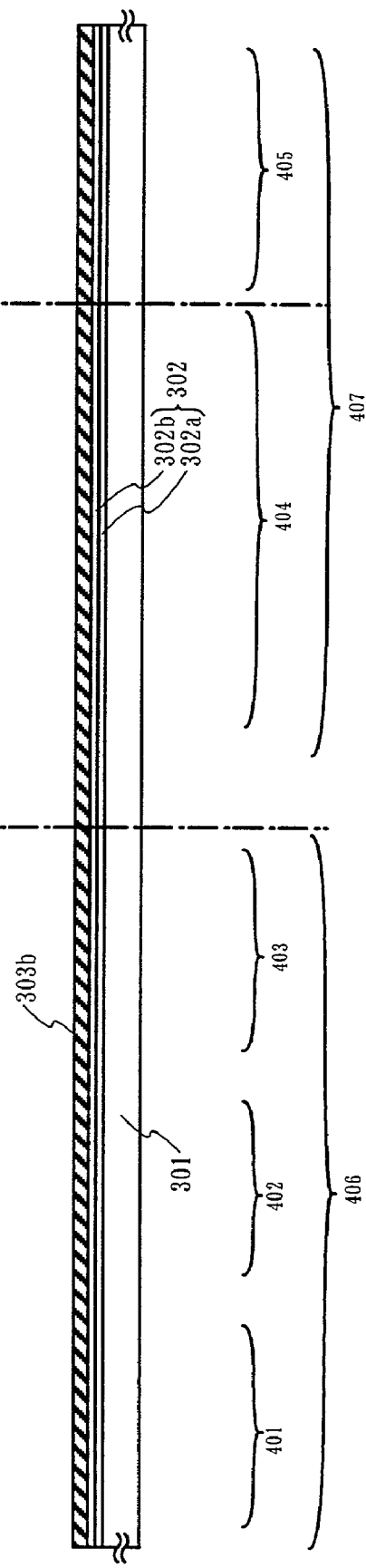

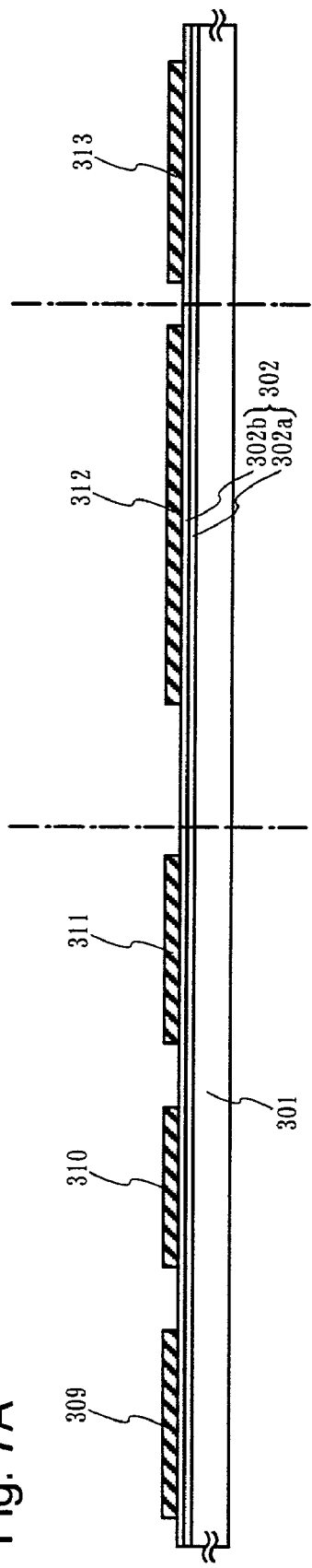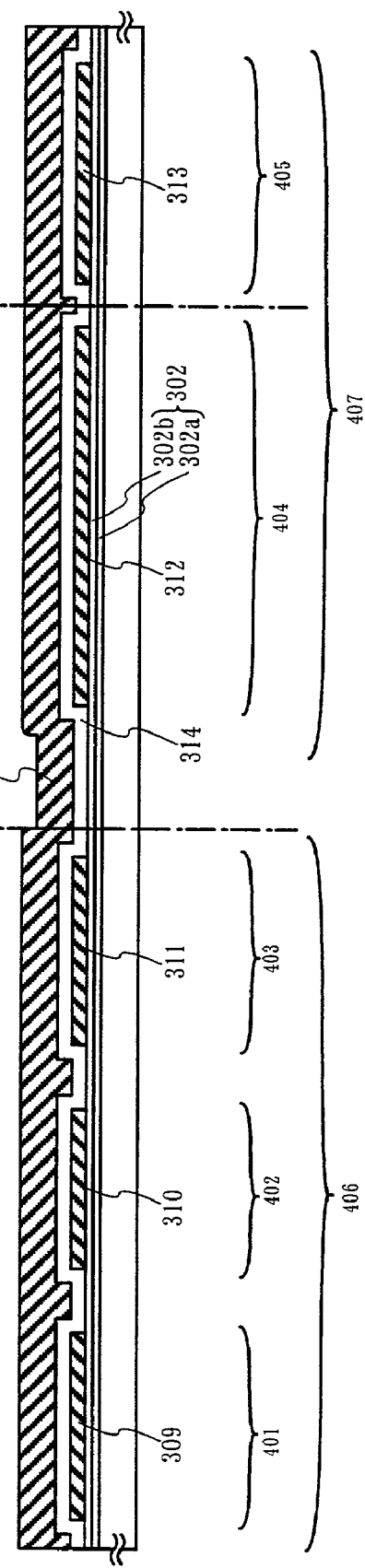

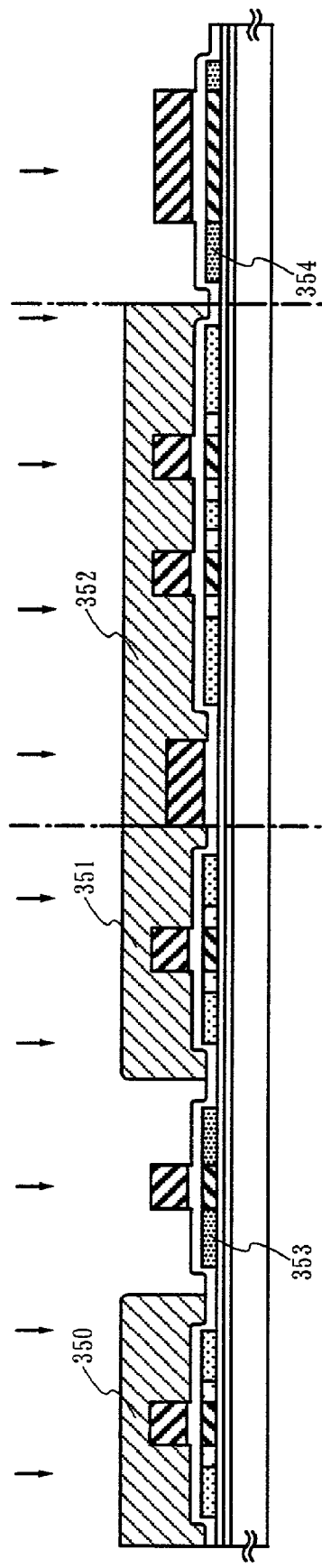
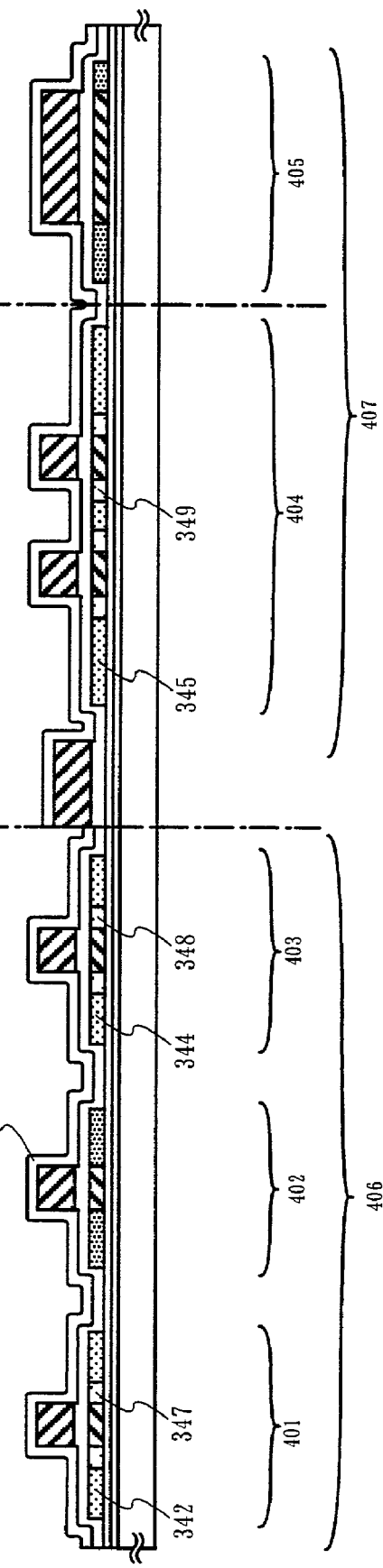
Fig. 9A
Fig. 9B

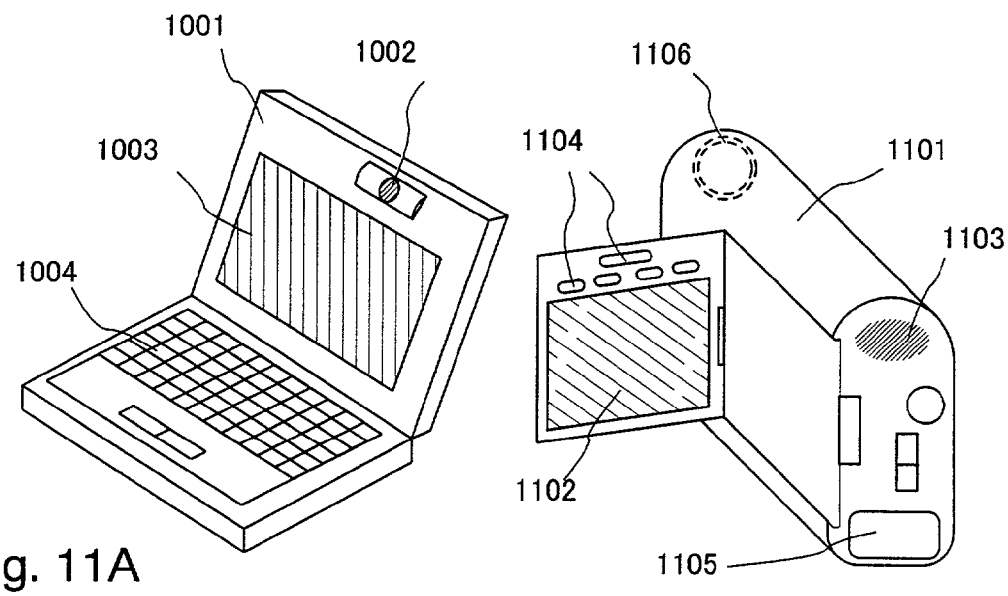
Fig. 11A
Fig. 11B
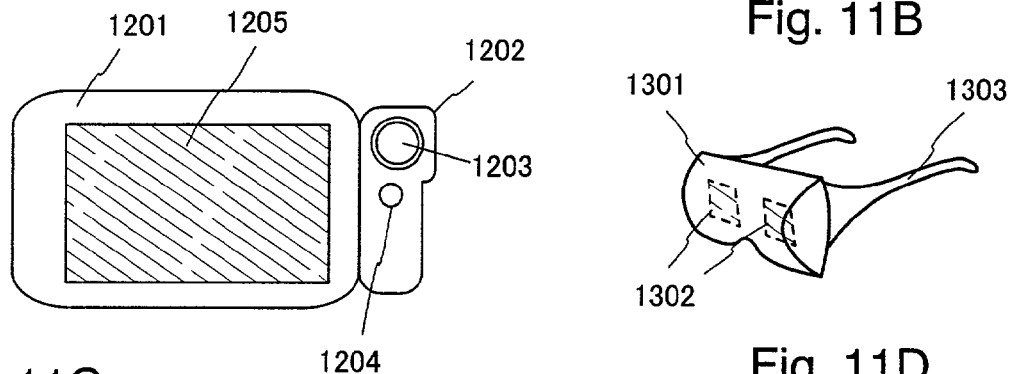
Fig. 11C
Fig. 11D
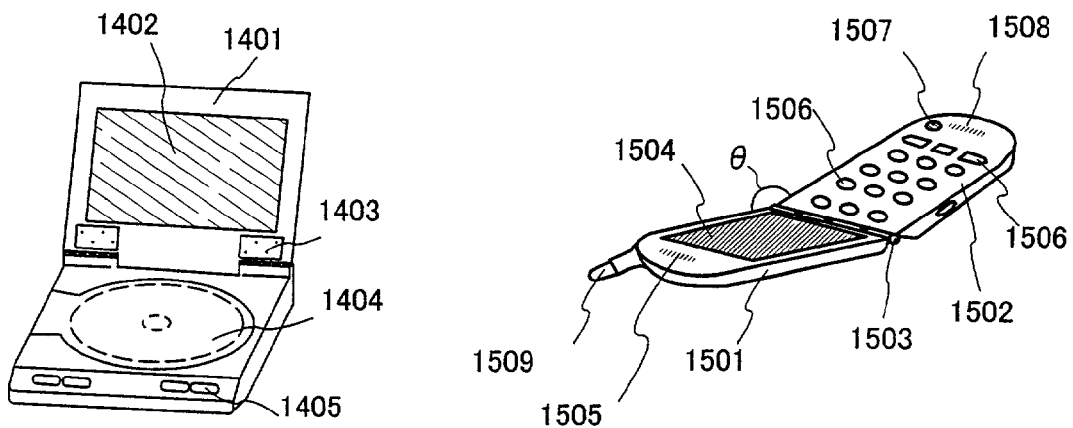
Fig. 11E
Fig. 11F

METHOD OF MANUFACTURING SEMICONDUCTOR DEVICE

BACKGROUND OF THE INVENTION

1. Field of the Invention

The present invention relates to a method of manufacturing a semiconductor device using an ion doping method, and more specifically to a method of forming a protective film as a pretreatment in an ion doping step. In this specification, the "semiconductor device" denotes any of semiconductor devices in general which has a circuit structure with a thin film transistor (hereinafter abbreviated as a "TFT"), and semiconductor display device such as an active matrix type liquid crystal display device, an organic electro-luminescence (EL) display device, or the like are included in this category.

2. Description of the Related Art

Recently, demands for active matrix type liquid crystal display devices have increased rapidly and development of the technique for manufacturing TFTs with a semiconductor film formed on a glass substrate or a quartz substrate has been carried out actively. TFTs manufactured on an insulating substrate such as a glass substrate or the like in a unit of one million and several hundreds of thousands of pieces have to exhibit predetermined electric characteristics according to the function of an electric circuit to be formed therewith. There is a parameter called "Vth" as one of the electric characteristics of a TFT.

The "Vth" denotes a gate voltage measured at the moment when a drain current of a TFT starts flowing and is defined as a voltage at which an inversion layer is formed in a channel region. Hence, it can be said that the higher the Vth is, the higher the TFT operating voltage is.

Note that, the Vth has a problem in that it fluctuates easily by various external factors including, for instance, contamination impurities in an active layer, fixed and mobile charges in a gate insulating film, an interface level at an active layer/gate insulating film interface, and the difference in work function between a gate electrode and an active layer. In this case, the contamination impurities in an active layer, the mobile charge in a gate insulating film, and the like can be reduced through cleaning in processes. However, the fixed charge, the interface level, and the difference in work function depend on the device material and thus cannot be modified easily.

The above-mentioned external factors cause the Vth of a TFT to shift to the plus or minus side to vary. In TFT manufacturing steps, control of variable Vth is an important technique, and a channel doping technique has been known as a Vth control technique. The "channel doping" is a technique for controlling Vth by adding a predetermined concentration of impurity to an active layer located under a gate insulating film to shift the Vth of a TFT intentionally so that the Vth reaches a desired level. For example, a p-type impurity element is used as a dopant when the Vth shifts to the minus side, while an n-type impurity element is used as a dopant when the Vth shifts to the plus side. Thus, the Vth is controlled.

For such channel doping, an ion doping method for doping with an n-type or p-type impurity element is used. The ion doping method is a method of implanting an impurity element without implementing mass separation. Since the ion doping method employs no mass separation means, it is easy to achieve an increase in area subjected to processing. Hence, the ion doping method is generally applied to the manufacture of an active matrix type liquid crystal display device. In the ion doping method, B(boron), Ga(gallium), or In(indium) is used as a p-type impurity, and P(phosphorus), As(arsenic), Sb(antimony), or the like is used as an n-type impurity.

When a doping process such as channel doping or the like is carried out directly with respect to a silicon-based semiconductor film as an active layer of a TFT, there is a problem in that the silicon-based semiconductor film is etched. Conventionally, as measures for solving the problem, a protective film such as a silicon oxide film, a silicon oxynitride film, or the like is deposited by a chemical vapor deposition (CVD) method as a pretreatment in a doping step and then the process of doping with impurity ions is conducted from the top of the protective film. However, the measures have the following demerits and therefore are not preferable.

First, since the CVD method is applied to the mere pretreatment, the time required for the pretreatment is lengthened and the processing time required for the whole step of doping with impurity ions is also lengthened accordingly. Therefore, with respect to the whole step of doping with impurity ions, the above-mentioned measures are not preferable in terms of throughput since the number of substrates to be processed per unit time is reduced. In addition, the above-mentioned measures also are not preferable in view of the fact that the cost for the pretreatment increases since a CVD apparatus such as a plasma CVD apparatus, a low pressure CVD apparatus, or the like is used for the pretreatment and thus the whole production cost increases accordingly. Therefore, an easy low-cost measure for preventing etching has been requested as a measure for preventing a silicon-based semiconductor film from being etched.

SUMMARY OF THE INVENTION

The present invention is intended to solve the above-mentioned problems inherent in the conventional technique. More specifically, the present invention is intended to provide a step of doping a silicon-based semiconductor film with an easy low-cost pretreatment step as a measure for preventing the silicon-based semiconductor film from being etched. In other words, the present invention is intended to provide a method of manufacturing a semiconductor device including a measure for preventing a silicon-based semiconductor film from being etched by the above-mentioned pretreatment step.

Experiment on Pretreatment for Channel Doping

Since an active layer of a TFT is formed from a silicon-based semiconductor film such as an amorphous silicon film, a polycrystalline silicon film, a crystalline silicon film formed using a catalytic element, or the like, it is possible to form a chemical oxide film as an ultrathin silicon oxide film by an easy treatment step such as an ozone water treatment or the like. If the above-mentioned chemical oxide film can function as a protective film during the step of ion-doping the silicon-based semiconductor film, the above-mentioned problems of the conventional art can be solved. Accordingly, the following experiment was conducted under the experimental conditions indicated in Table 1.

In the specification, the chemical oxide film is a film formed by use of liquid chemicals having oxidation such as ozone water or a hydrogen peroxide solution. In general, the chemical oxide film is 5 nm thick or less.

First, an amorphous silicon film with a thickness of 53 nm was deposited on each of four glass substrates Nos. 1 to 4 at a deposition temperature of 300 C by a plasma CVD method. Since a natural oxide film was attached to each amorphous silicon film, it was removed with dilute hydrofluoric acid. Next, with respect to the two substrates Nos. 2 and 4, the whole surface of the amorphous silicon film was oxidized with ozone water and thus a chemical oxide film (an ultrathin silicon oxide film) with a thickness of 5 nm or less was formed. Afterward, using an ion doping apparatus, the four substrates Nos. 1 to 4 were subjected to a process of doping with a dose of boron having a range of $1\times10^{13}$ to $1\times10^{14}$ atoms/cm$^2$. The experiment was conducted using a material gas obtained by diluting diborane ($B_2H_6$) gas with hydrogen as a material gas of the boron with respect to the cases of dilution ratios of 0.1% and 1.0%. After the ion doping, the thickness of the residue of each amorphous silicon film was measured. Thus, the state of etching caused during the doping process was examined.

The results of this experiment are shown in FIG. 1. As can be seen from FIG. 1, it was observed that the amorphous silicon film was etched during the doping process when the chemical oxide film had not been formed on the surface of the amorphous silicon film by the ozone water treatment, while the amorphous silicon film was hardly etched when the chemical oxide film had been formed on the surface of the amorphous silicon film. It was also observed that in the case of using diborane gas with a dilution ratio of 0.1%, the etching of the amorphous silicon film was progressed further as compared to the case of using diborane gas with a dilution ratio of 1.0%, in other words, a higher hydrogen ion ratio caused heavier etching of the amorphous silicon film. Accordingly, it is considered that the reaction with hydrogen ions participates in the etching of the amorphous silicon film (see FIG. 1).

The results of this experiment show that the chemical oxide film with a thickness of 5 nm or less formed using ozone water can prevent the amorphous silicon film from being etched due to the hydrogen ions during the doping process. The method of forming the chemical oxide film is not limited to the treatment with ozone water. The chemical oxide film can be formed by a treatment with a hydrogen peroxide solution. Alternatively, an ultrathin silicon oxide film can also be formed by ultraviolet (UV) irradiation in an atmosphere containing oxygen although it is not a chemical oxide film. It is considered that no matter which method is used for its formation, the amorphous silicon film can be prevented from being etched due to the hydrogen ions.

In this experiment, the discussion was directed to the chemical oxide film with a thickness of 5 nm or less. However, it is considered that etching also can be prevented to some degree by making unsaturated bonds present at the surface of the amorphous silicon film terminate with oxygen when the hydrogen ion ratio is low in the ion doping apparatus. When being terminated with oxygen, the unsaturated bonds become Si—O bonds and the bonding energy (193.5 kcal/mol) of the Si—O bonds is higher than that (71.5 kcal/mol) of Si—H bonds. Therefore, even when the hydrogen ions approach the Si—O bonds, the reaction with the hydrogen ions is depressed. Thus, it is suggested that the amorphous silicon film can be prevented from being etched when the unsaturated bonds present at the surface of the amorphous silicon film are made to terminate with an element to be bonded with bonding energy higher than that of the Si—H bonds.

The above-mentioned bonding energies of the Si—H bonds and the Si—O bonds are cited from the data as to the bond strength of diatomic molecules (Table 1 0.35) described on page 561 of Applied Physics Data Book (edited by The Japan Society of Applied Physics).

According to the above-mentioned experiment, the following inventions are led out which are effective in the case of doping with a material gas producing hydrogen ions. Note that examples of the material gas producing hydrogen ions include diborane($B_2H_6$), phosphine($PH_3$), arsine($AsH_3$), and those obtained through dilution thereof with hydrogen. Furthermore, when ion implantation is conducted using an ion implantation apparatus having a mass separation means, it is considered that the silicon film is not etched since basically hydrogen ions can be removed by mass separation.

Invention 1

In the step of ion-doping a silicon-based semiconductor film, a step of forming a chemical oxide film on the surface of the silicon-based semiconductor film is introduced as a pretreatment in place of the formation of a protective film by the CVD method.

Invention 2

In the step of ion-doping a silicon-based semiconductor film, a step of terminating unsaturated bonds present at the surface of the silicon-based semiconductor film with an element to be bonded with bonding energy higher than that (71.5 kcal/mol) of Si—H bonds (hereinafter simply referred to as an "unsaturated bond termination step") is introduced as a pretreatment in place of the formation of a protective film by the CVD method.

Method of Manufacturing a Semiconductor Device

In order to solve the above-mentioned problems in the conventional art, the configurations of the present invention are described from the viewpoint of the method of manufacturing a semiconductor device.

According to one aspect of the present invention, a method of manufacturing a semiconductor device includes a first step of forming a silicon-based semiconductor film on an insulating substrate and a second step of doping the silicon-based semiconductor film with impurity ions, and is characterized in that the second step includes, as a pretreatment, the steps of: forming a chemical oxide film on the surface of the silicon-based semiconductor film; terminating unsaturated bonds present at the surface of the silicon-based semiconductor film with oxygen; or terminating the unsaturated bonds present at the surface of the silicon-based semiconductor film with an element to be bonded with bonding energy higher than that of Si—H bonds.

According to another aspect of the present invention, a method of manufacturing a semiconductor device includes: a first step of forming a silicon-containing amorphous semiconductor film on an insulating substrate; a second step of carrying out channel doping with respect to the silicon-containing amorphous semiconductor film; a third step of heat-treating the silicon-containing amorphous semiconductor film to form a silicon-containing polycrystalline semiconductor film; a fourth step of forming a semiconductor film to serve as an active layer of a TFT through pattern formation of the silicon-containing polycrystalline semiconductor film; a fifth step of depositing a gate insulating film on the semiconductor film; a sixth step of forming gate electrodes on the semiconductor film with the gate insulating film interposed therebetween; and a seventh step of doping the semiconductor film with impurity ions with the gate electrodes used as a mask, and is characterized in that the second step includes, as a pretreatment, the steps of: forming a chemical oxide film on the surface of the silicon-containing amorphous semiconductor film; terminating unsaturated bonds present at the surface of the silicon-containing amorphous semiconductor film with oxygen; or terminating the unsaturated bonds present at the surface of the silicon-containing amorphous semiconductor film with an element to be bonded with bonding energy higher than that of Si—H bonds.

According to still another aspect of the present invention, a method of manufacturing a semiconductor device includes: a first step of depositing a silicon-containing amorphous semiconductor film on an insulating substrate and heat-treating it to form a silicon-containing polycrystalline semiconductor film; a second step of carrying out channel doping with respect to the silicon-containing polycrystalline semiconductor film; a third step of forming a semiconductor film to serve as an active layer of a TFT through pattern formation of the silicon-containing polycrystalline semiconductor film; a fourth step of depositing a gate insulating film on the semiconductor film; a fifth step of forming gate electrodes on the semiconductor film with the gate insulating film interposed therebetween; and a sixth step of doping the semiconductor film with impurity ions with the gate electrodes used as a mask, and is characterized in that the second step includes, as a pretreatment, the steps of: forming a chemical oxide film on the surface of the silicon-containing polycrystalline semiconductor film; terminating unsaturated bonds present at the surface of the silicon-containing polycrystalline semiconductor film with oxygen; or terminating the unsaturated bonds present at the surface of the silicon-containing polycrystalline semiconductor film with an element to be bonded with bonding energy higher than that of Si—H bonds.

According to yet another aspect of the present invention, a method of manufacturing a semiconductor device includes: a first step of depositing a silicon-containing amorphous semiconductor film on an insulating substrate, adding a catalytic element having an effect of accelerating crystallization to the amorphous semiconductor film, and heat-treating it to form a silicon-containing crystalline semiconductor film; a second step of carrying out channel doping with respect to the silicon-containing crystalline semiconductor film; a third step of forming a semiconductor film to serve as an active layer of a TFT through pattern formation of the silicon-containing crystalline semiconductor film; a fourth step of depositing a gate insulating film on the semiconductor film; a fifth step of forming gate electrodes on the semiconductor film with the gate insulating film interposed therebetween; and a sixth step of doping the semiconductor film with impurity ions with the gate electrodes used as a mask, and is characterized in that the second step includes, as a pretreatment the steps of: forming a chemical oxide film on the surface of the silicon-containing crystalline semiconductor film; terminating unsaturated bonds present at the surface of the silicon-containing crystalline semiconductor film with oxygen; or terminating the unsaturated bonds present at the surface of the silicon-containing crystalline semiconductor film with an element to be bonded with bonding energy higher than that of Si—H bonds.

According to another aspect of the present invention, a method of manufacturing a semiconductor device includes: a first step of depositing a silicon-containing amorphous semiconductor film on an insulating substrate; a second step of carrying out channel doping with respect to the silicon-containing amorphous semiconductor film; a third step of adding a catalytic element having an effect of accelerating crystallization to the silicon-containing amorphous semiconductor film and heat-treating it to form a silicon-containing crystalline semiconductor film; a fourth step of forming a semiconductor film to serve as an active layer of a TFT through pattern formation of the silicon-containing crystalline semiconductor film; a fifth step of depositing a gate insulating film on the semiconductor film; a sixth step of forming gate electrodes on the semiconductor film with the gate insulating film interposed therebetween; and a seventh step of doping the semiconductor film with impurity ions with the gate electrodes used as a mask, and is characterized in that the second step includes, as a pretreatment, the steps of: forming a chemical oxide film on the surface of the silicon-containing amorphous semiconductor film; terminating unsaturated bonds present at the surface of the silicon-containing amorphous semiconductor film with oxygen; or terminating the unsaturated bonds present at the surface of the silicon-containing amorphous semiconductor film with an element to be bonded with bonding energy higher than that of Si—H bonds.

In the above-mentioned aspects of the present invention, the silicon-based semiconductor film is not limited as long as it is a semiconductor film containing silicon. The silicon-based semiconductor film may be, for example, a silicon-containing amorphous semiconductor film, a silicon-containing polycrystalline semiconductor film that is obtained by heat-treating a silicon-containing amorphous semiconductor film, or a silicon-containing crystalline semiconductor film that is obtained by adding a catalytic element having an effect of accelerating crystallization to a silicon-containing amorphous semiconductor film and heat-treating it. In this specification, the technical terms of a silicon-containing amorphous semiconductor film, a silicon-containing polycrystalline semiconductor film, and a silicon-containing crystalline semiconductor film are distinguished from one another in their use. Hence, their definitions are made clear as follows. The "silicon-containing amorphous semiconductor film" denotes a silicon-containing amorphous film that is provided with semiconductor properties by being crystallized. The term of the silicon-containing amorphous semiconductor film, of course, covers amorphous silicon films and further all the silicon-containing amorphous semiconductor films. For example, the term also covers amorphous films formed of a compound of silicon and germanium expressed by a formula of $Si_xGe_{1-x}$ (0<X<1). The "silicon-containing crystalline semiconductor film" denotes a crystalline semiconductor film that is obtained using a catalytic element having an effect of accelerating crystallization. The silicon-containing crystalline semiconductor film is characterized by having crystal grains orientated in substantially the same direction, having higher field-effect mobility, and the like as compared to an ordinary polycrystalline semiconductor film. Hence, the silicon-containing crystalline semiconductor is described intentionally in distinction from the polycrystalline semiconductor film.

Here, the description is directed to the catalytic element having an effect of accelerating crystallization. The catalytic element is added to a silicon-containing amorphous semiconductor film in order to accelerate its crystallization. A metallic element such as Ni(nickel) or the like is used as the catalytic element. Besides the Ni element, typical metallic elements used as the catalytic element include Fe(iron), Co(cobalt), Ru(ruthenium), Rh(rhodium), Pd(palladium), Os(osmium), Ir(iridium), Pt(platinum), Cu(copper), Au(gold), and the like. As the catalytic element, usually one selected element is used, but a combination of two elements or more may be used. According to the experiments implemented by the present inventors et al., it has been proved that the Ni element is the most preferable catalytic element.

Furthermore, in the above-mentioned aspects of the present invention, examples of the impurity ions include n-type impurities represented by a P(phosphorus) element and an As(arsenic) element and p-type impurities represented by a B(boron) element. When using the phosphorous element, the As element, and the boron element, an ion source obtained by diluting phosphine ($PH_3$) with hydrogen, an ion source obtained by diluting arsine ($AsH_3$) with hydrogen, and an ion source obtained by diluting diborane ($B_2H_6$) with hydrogen are used, respectively. Since all the ion sources are obtained through dilution with hydrogen, hydrogen ions are produced in doping. It is considered that when a silicon-based semiconductor film is doped with such impurity ions, the hydrogen ions act as an etchant for the silicon-based semiconductor film.

In the above-mentioned aspects of the present invention, a typical example of the chemical oxide film formed on the surface of the silicon-based semiconductor film is a silicon oxide film with a thickness of 5 nm or less obtained by a treatment with ozone water, but the chemical oxide film may be formed by a treatment with a hydrogen peroxide solution. Alternatively, an ultrathin silicon oxide film having an effect similar to that of the chemical oxide film can also be formed by ultraviolet (UV) irradiation in an atmosphere containing oxygen although it is not an exact chemical oxide film. Furthermore, in place of the formation of the chemical oxide film, it is also considered to terminate unsaturated bonds present at the surface of the silicon-based semiconductor film with oxygen or with an element to be bonded with bonding energy higher than that of Si—H bonds.

According to the present invention with the configurations as described above, since a chemical oxide film formed by a simple method is used as a protective film for the silicon-based semiconductor film when the silicon-based semiconductor film is doped with impurity ions, the present invention is effective in improving throughput of the whole ion doping step. In addition, since an expensive plasma CVD apparatus or low pressure CVD apparatus is no longer necessary for the pretreatment in the ion doping step, the present invention is effective in reducing production cost. In the case where unsaturated bonds present at the surface of the silicon-based semiconductor film are made to terminate with an element to be bonded with bonding energy higher than that of Si—H bonds, for example, with oxygen in place of the formation of the chemical oxide film, this termination step is considered to have an effect similar to that of the chemical oxide film since it is easier than the CVD step.

BRIEF DESCRIPTION OF THE DRAWINGS

In the accompanying drawings:

FIG. 1 shows experimental data indicating dependence of the thickness of an amorphous silicon residual film on a dose;

FIGS. 4A to 4E are cross-sectional views showing TFT manufacturing steps;

FIGS. 6A and 6B are cross-sectional views showing steps of manufacturing an active matrix type liquid crystal display device;

FIGS. 7A and 7B are cross-sectional views showing steps of manufacturing the active matrix type liquid crystal display device;

FIGS. 9A and 9B are cross-sectional views showing steps of manufacturing the active matrix type liquid crystal display device;

FIGS. 11A to 11F are schematic drawings showing devices as examples of electronic equipment with a semiconductor display device installed therein;

DETAILED DESCRIPTION OF THE PREFERRED EMBODIMENTS

Embodiment Mode 1

Figure 2A:
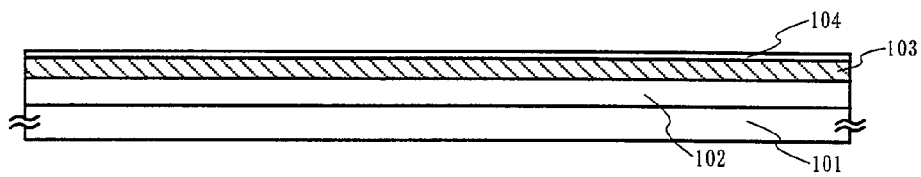
FIGS. 2A to 2E are cross-sectional views showing TFT manufacturing steps.
Figure 2B:

In the present embodiment mode, as an example of a method of manufacturing TFTs in which channel doping is conducted with respect to a silicon-based semiconductor film with a crystal structure, a method of manufacturing TFTs in which channel doping is conducted with respect to a crystalline silicon film crystallized using a catalytic element is described concretely with reference to FIGS. 2A to 3D. Note that the channel doping is conducted with respect to an n-channel type TFT alone.

First, a base film 102 made of a silicon oxynitride film with a thickness of 100 nm is deposited on a glass substrate 101 by the plasma CVD method. Subsequently, an amorphous silicon film 103 with a thickness of 15 to 70 nm, more preferably a thickness of 30 to 60 nm is deposited thereon. In the present embodiment mode, the amorphous silicon film 103 with a thickness of 50 nm was deposited by the plasma CVD method. In depositing the amorphous silicon film 103, a natural oxide film (not shown) is attached to the surface of the amorphous silicon film 103 due to the effect of oxygen in the air. Therefore, washing is implemented by a treatment with dilute hydrofluoric acid. Afterward, a chemical oxide film 104 made from an ultrathin silicon oxide film is formed on the surface of the amorphous silicon film 103 by an ozone water treatment conducted for a predetermined time. This chemical oxide film 104 is formed for the purpose of improving wettability with respect to a Ni aqueous solution as a solution including a catalytic element (hereinafter referred to as a "catalytic element solution") to be applied later by a spin coating method. Note that in the present embodiment mode, the amorphous silicon film 103 was deposited, but besides the amorphous silicon film 103, it is also possible to use a silicon-containing amorphous semiconductor film, for example, an amorphous semiconductor film made of a compound of silicon and germanium expressed by a formula of $Si_xGe_{1-x}$ (0<X<1). Furthermore, the chemical oxide film 104 was formed by the ozone water treatment but may be formed by a treatment with a hydrogen peroxide solution (see FIG. 2A).

Next, the Ni aqueous solution as a catalytic element solution is applied to the whole surface of the amorphous silicon film 103 (strictly speaking, the chemical oxide film 104) by the spin coating method. Preferable Ni concentration of the Ni aqueous solution is in the range of 0.1 to 50 ppm by weight, more preferably about 1 to 30 ppm by weight. In the present embodiment mode, a Ni aqueous solution with a Ni concentration of 10 ppm by weight was applied by the spin coating method. In the spin coating, the substrate is rotated and thus an excess of the Ni aqueous solution is blown off to be removed. Thus, an ultrathin Ni-containing film 105 is formed over the whole surface of the amorphous silicon film 103 (strictly speaking, the chemical oxide film 104) (see FIG. 2B).

Next, the amorphous silicon film 103 is heat-treated in a nitrogen atmosphere using a special-purpose heat treating furnace. Due to the effect of the catalytic element that accelerates crystallization, crystallization is achieved by the heat treatment that is carried out in a temperature range of 450 to 750 C. However, this heat treatment has a general characteristic that a treatment time is lengthened when the heat treatment temperature is low, thereby decreasing production efficiency. In addition, in the heat treatment at 600 C or higher, there arises a problem in heat resistance of the glass substrate used as the substrate. Hence, when the glass substrate is used, a suitable temperature to be employed in the above-mentioned heat treatment step is in the range of 450 C to 600 C Furthermore, suitable heat treatment conditions in an actual heat treatment vary depending on the method of depositing the amorphous silicon film 103. It has been proved that, for instance, when the amorphous silicon film 103 is deposited by a low pressure CVD method, it is suitable to carry out the heat treatment at 600 C for about 12 hours, and when the amorphous silicon film 103 is deposited by the plasma CVD method, it is sufficient to carry out the heat treatment at 550 C for about 4 hours. In the present embodiment mode, since the amorphous silicon film 103 with a thickness of 50 nm was deposited by the plasma CVD method, a heat treatment was carried out at 550 C for 4 hours to form a crystalline silicon film 106. As described above, the crystal growth method in which the Ni aqueous solution is applied to the whole surface of the amorphous silicon film 103, and then heat-treatment is conducted is named a longitudinal growth method by the present inventors et al. since the crystal growth progresses in the longitudinal direction from the surface of the amorphous silicon film 103 (in the direction perpendicular to the substrate surface) with the Ni element applied thereto (see FIG. 2B).

Next, in order to improve the crystallinity of the crystalline silicon film 106 thus obtained, laser irradiation is conducted with respect to the crystalline silicon film 106. When only being heat-treated by using an electrothermal furnace, the crystalline silicon film 106 is in an imperfectly crystallized state and includes amorphous components irregularly remaining therein. In this embodiment mode, for the purpose of improving the imperfect crystallization, a pulse oscillation type KrF excimer laser (with a wavelength of 248 nm) is used for the laser irradiation with respect to the crystalline silicon film 106. Since this excimer laser emits ultraviolet light, instantaneous melting and solidification are repeated in the region subjected to the laser irradiation. Hence, in the region subjected to the laser irradiation, a kind of non-equilibrium state is realized, which results in a state where the Ni element can move very easily. It is also possible to omit this laser irradiation step. Besides the effect of improving crystallinity, however, the laser irradiation step also provides an effect of improving the efficiency of the later gettering step. Hence, it is preferable that the laser irradiation step be not omitted (see FIG. 2B).

Figure 2C:
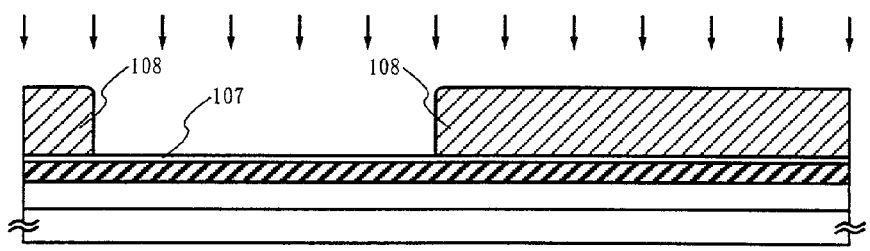
Figure 2D:
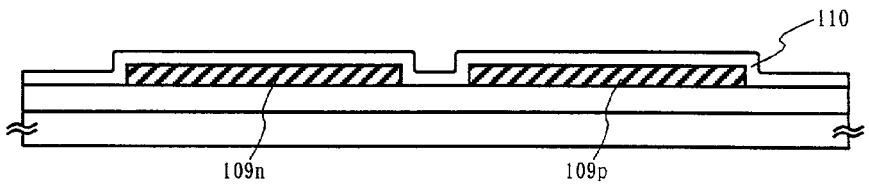
Figure 2E:
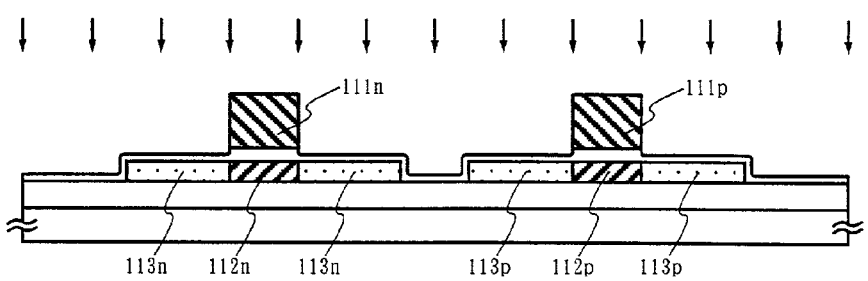

Next, since a contamination film such as the Ni-containing film 105 or the like is attached to the surface of the crystalline silicon film 106 thus obtained, it is washed with dilute hydrofluoric acid, thereby cleaning the surface of the crystalline silicon film 106. Afterward, as a pretreatment for channel doping, an ozone water treatment is carried out for a predetermined time to form a chemical oxide film 107 made of an ultrathin silicon oxide film with a thickness of 5 nm or less on the surface of the crystalline silicon film 106. In this embodiment mode, the chemical oxide film 107 is formed by the ozone water treatment but may be formed by a treatment with a hydrogen peroxide solution. An ultrathin silicon oxide film having a similar effect to that of the chemical oxide film can also be formed by ultraviolet (UV) irradiation in an atmosphere containing oxygen although it is not an exact chemical oxide film (FIG. 2C).

When the hydrogen ion ratio is low in an ion doping apparatus used in the channel doping step, it is also considered as the pretreatment for channel doping that unsaturated bonds present at the surface of the crystalline silicon film 106 are made to terminate with an element to be bonded with bonding energy higher than that (71.5 kcal/mol) of Si—H bonds such as oxygen or the like.

Next, a resist pattern 108 to serve as a mask for channel doping is formed with using the region corresponding to an n-channel type TFT of the crystalline silicon film 106 as its opening region. Afterward, using the ion doping apparatus, the region corresponding to the n-channel type TFT of the crystalline silicon film 106 is doped with a boron element as a p-type impurity with the resist pattern 108 used as a mask, and thus channel doping is implemented. In the channel doping, an ion source is used that is obtained through dilution of diborane ($B_2H_6$) gas with hydrogen. Generally, the channel doping is carried out under the doping conditions including a diborane dilution ratio of 0.01 to 1.0%, an accelerating voltage of 1 to 50 kV, an ion current of 10 to 500 nA, and a dose of $1\times10^{11}$ to $1\times10^{14}$ atoms/cm². In the present embodiment mode, the doping process was carried out under the channel doping conditions including a diborane dilution ratio of 0.1%, an accelerating voltage of 15 kV, an ion current of 50 nA, and a dose of $4\times10^{13}$ atoms/cm² (see FIG. 2C).

Next, the resist pattern 108 that has served as a mask for channel doping is removed. Afterward, pattern formation of the crystalline silicon film 106 is carried out by ordinary photolithography and dry etching to form a semiconductor film 109n corresponding to the n-channel type TFT and a semiconductor film 109p corresponding to a p-channel type TFT. Here, a natural oxide film (or the chemical oxide film 107 formed by the pretreatment for channel doping) has been formed on each surface of the semiconductor films 109n and 109p. Hence, it is removed by a treatment with dilute hydrofluoric acid. In this manner, the surfaces of the semiconductor films 109n and 109p made of the crystalline silicon film 106 are cleaned and then a gate insulating film 110 made of a silicon oxide film with a thickness of 100 nm is formed by the plasma CVD method or the low pressure CVD method (see FIG. 2D).

Next, an conductive film (with a thickness of 400 nm) as a gate electrode material is deposited by a sputtering method or a CVD method and is subjected to pattern formation by the ordinary photolithography and dry etching. Thus, a gate electrode 111n corresponding to the n-channel type TFT and a gate electrode 111p corresponding to the p-channel type TFT are formed. As a gate electrode material used here, a heat resistant material is preferable that can withstand the heat treatment temperature (about 550 to 650 C) for gettering as a later step that also serves for activating the impurity ions with which the semiconductor films 109n and 109p are doped. Examples of the heat resistant material include high melting metals such as Ta(tantalum), Mo(molybdenum), Ti(titanium), W(tungsten), Cr(chromium), and the like, metal silicide as a compound of a high melting metal and silicon, polycrystalline silicon having n-type or p-type conductivity, and the like. In the present embodiment mode, a W metal film with a thickness of 400 nm was applied (see FIG. 2E).

Next, using the ion doping apparatus, doping with a phosphorous element as an n-type impurity is conducted with the gate electrodes 111$n$ and 111$p$ used as a mask. This ion doping process is carried out under the conditions including an accelerating voltage of 10 to 100 kV and a dose of $1\times10^{14}$ to $1\times10^{16}$ atoms/cm$^2$. In the present embodiment mode, the doping process was carried out under the conditions including an accelerating voltage of 80 kV and a dose of $1.7\times10^{15}$ atoms/cm$^2$. By this ion doping process, high-concentration impurity regions (n$^+$ regions) 113$n$ having an n type conductivity type to function as source and drain regions and a substantially intrinsic region 112$n$ to function as a channel region are formed in the semiconductor film 109$n$ corresponding to the n-channel type TFT. Additionally, in the semiconductor film 109$p$ corresponding to the p-channel type TFT are formed high-concentration impurity regions (n$^+$ regions) 113$p$ having an n type conductivity type and a substantially intrinsic region 112$p$ to function as a channel region (see FIG. 2E).

Next, a resist pattern 114 is formed with using the whole region of the semiconductor film 109$p$ corresponding to the p-channel type TFT as its opening region. Afterward, using the ion doping apparatus, doping with a boron element as a p-type impurity is conducted with the resist pattern 114 and the gate electrode 111$p$ corresponding to the p-channel type TFT used as a mask. This ion doping process is carried out under the conditions including an accelerating voltage of 10 to 100 kV and a dose of $2\times10^{14}$ to $5\times10^{16}$ atoms/cm$^2$. In the present embodiment mode, the doping process was carried out under the conditions including an accelerating voltage of 60 kV and a dose of $2.5\times10^{15}$ atoms/cm$^2$. This ion doping process causes reversal of the conductivity type of the n-type high-concentration impurity regions 113$p$ corresponding to the p-channel type TFT to form high-concentration impurity regions (p$^+$ regions) 115$p$ having a p type conductivity type to function as source and drain regions (see FIG. 3A).

Next, after the resist pattern 114 is removed, a first interlayer insulating film 116 made from an inorganic film with a thickness of 100 to 300 nm is deposited. In this embodiment mode, the first interlayer insulating film 116 is deposited which is formed from a silicon oxynitride film with a thickness of 150 nm by the plasma CVD method. Afterward, for the purpose of thermal activation of the impurity elements (the n-type and p-type impurities) with which the semiconductor films 109$n$ and 109$p$ have been doped, a heat treatment is conducted at 600 C for 12 hours using an electrothermal furnace. This heat treatment is carried out for the thermal activation process of the impurity elements but also for gettering process of an unwanted catalytic element (Ni element) contained in the substantially intrinsic regions 112$n$ and 112$p$ to function as channel regions. The TFTs having the crystalline silicon film manufactured by this method have high field-effect mobility and excellent electric characteristics such as a reduced off-state current or the like since the unwanted catalytic element (Ni element) in the channel regions is gettered. Afterward, in order to terminate unsaturated bonds present at the surfaces of the semiconductor films 109$n$ and 109$p$, a hydrogen treatment is conducted in a 3% hydrogen-containing nitrogen atmosphere at 410 C for one hour (see FIG. 3B).

Figure 3A:
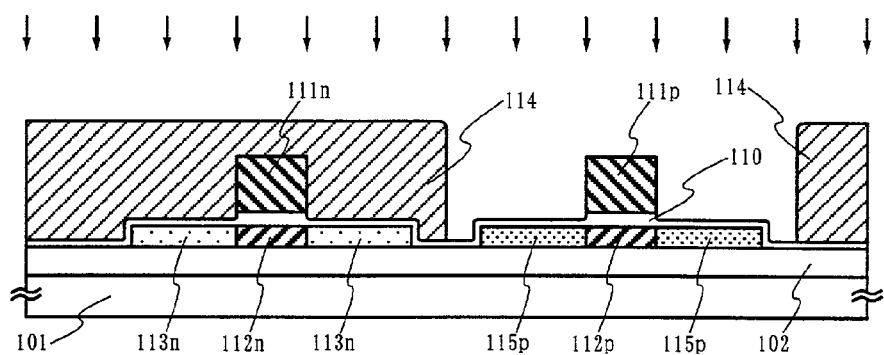
FIGS. 3A to 3D are cross-sectional views showing TFT manufacturing steps.
Figure 3B:
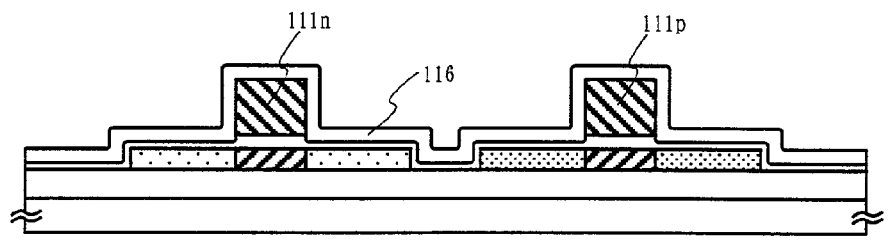
Figure 3C:
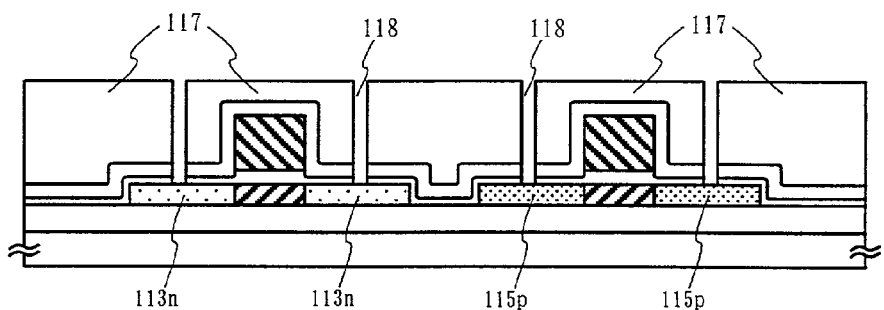
Figure 3D:
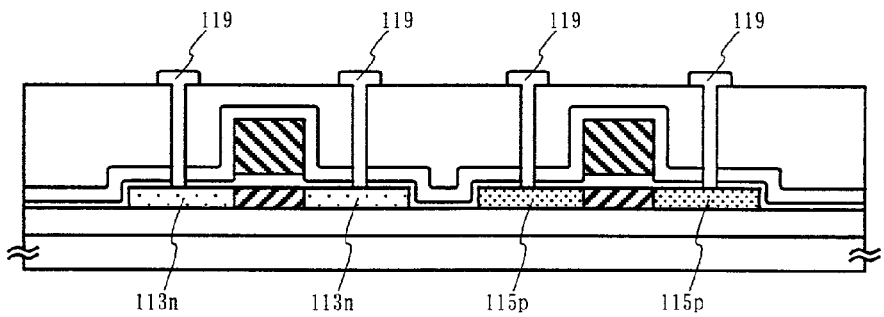

Next, a second interlayer insulating film 117 made of a transparent organic film with a thickness of 1 to 3 μm is formed on the first interlayer insulating film 116. In this embodiment mode, a second interlayer insulating film 117 is formed from an acrylic resin film with a thickness of 1.6 μm. Afterward, by the ordinary photolithography and dry etching, contact holes 118 are formed in the gate insulating film 110 present under the first interlayer insulating film 116 as well as the second interlayer insulating film 117 and the first interlayer insulating film 116 (FIG. 3C).

Next, a metal film with a thickness of 200 to 800 nm having conductivity is deposited. In the present embodiment mode, a laminated film composed of a Ti film with a thickness of 50 nm and an Al—Ti alloy film with a thickness of 500 nm is deposited by the sputtering method. Afterward, the ordinary photolithography and dry etching are carried out to form metal wirings 119. The respective metal wirings 119 are connected to the source and drain regions 113$n$ corresponding to the n-channel type TFT and to the source and drain regions 115$p$ corresponding to the p-channel type TFT through the contact holes 118 (see FIG. 3D).

As described above, the TFTs can be manufactured through application of the channel doping pretreatment step of forming a chemical oxide film and channel doping with respect to the crystalline silicon film formed using a catalytic element. The step of forming the chemical oxide film is applied as the pretreatment for channel doping because it provides an effect of preventing the crystalline silicon film from being etched during the channel doping. However, when unsaturated bonds present at the crystalline silicon film surface are made to terminate with an element to be bonded with bonding energy higher than that (71.5 kcal/mol) of the Si—H bonds such as oxygen, an etching protective effect similar to that provided by the formation of a chemical oxide film can be expected. In this embodiment mode, the channel doping pretreatment step of forming a chemical oxide film and channel doping are applied to the formation of the crystalline silicon film using the catalytic element but of course, can be applied to the formation of an ordinary polycrystalline silicon film crystallized by a simple heat treatment alone (without using the catalytic element).

Embodiment Mode 2

In the present embodiment mode, an example of a TFT manufacturing method in which channel doping is carried out with respect to an amorphous silicon film is described concretely with reference to FIGS. 4A to 5B. Here, the channel doping is carried out only with respect to an n-channel type TFT. In addition, the description with respect to the step of crystallizing the amorphous silicon film after the channel doping is directed to the case where crystallization is conducted using a catalytic element. The steps carried out after the deposition of a gate insulating film (including the steps shown in FIGS. 3A to 3D in Embodiment mode 1) are basically identical to those in Embodiment mode 1 and therefore their description is omitted here.

First, a base film 202 made of a silicon oxynitride film with a thickness of 100 nm is deposited on a glass substrate 201 by the plasma CVD method. Subsequently, an amorphous silicon film 203 with a thickness of 15 to 70 nm, more preferably a thickness of 30 to 60 nm is deposited thereon. In the present embodiment mode, the amorphous silicon film 203 with a thickness of 50 nm was deposited by the plasma CVD method. In depositing the amorphous silicon film 203, since a natural oxide film (not shown) is attached to the surface of the amorphous silicon film 203 due to the effect of oxygen in the air. Note that in the present embodiment mode, the amorphous silicon film 203 was deposited, but besides the amorphous silicon film 203, it is also possible to apply a silicon-containing amorphous semiconductor film, for example, an amorphous semiconductor film made of a compound of silicon and germanium expressed by a formula of $Si_xGe_{1-x}$ (0<X<1) (see FIG. 4A).

Figure 4A:
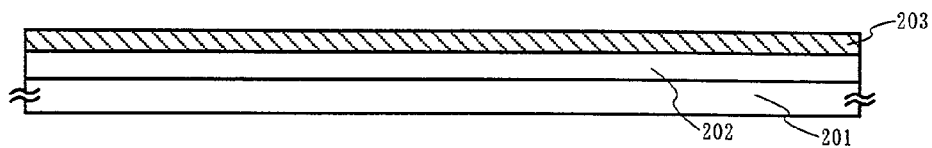
Figure 4B:
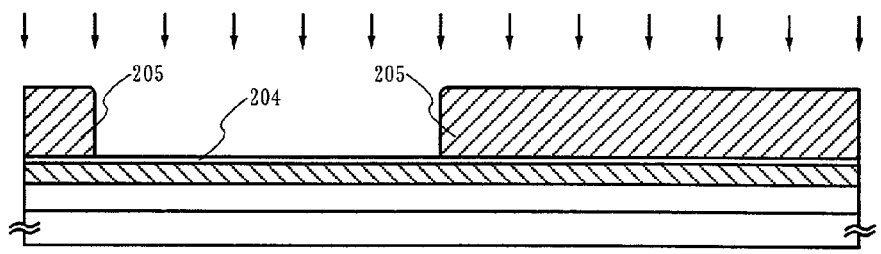

Next, the natural oxide film (not shown) attached to the surface of the amorphous silicon film 203 is washed with dilute hydrofluoric acid, thereby increasing the surface of the amorphous silicon film 203. Afterward, as a pretreatment for channel doping, a chemical oxide film 204 made of an ultrathin silicon oxide film with a thickness of 5 nm or less is formed on the surface of the amorphous silicon film 203 by an ozone water treatment carried out for a predetermined time. Note that in this embodiment mode, the chemical oxide film 204 is formed by the ozone water treatment but may be formed by a treatment using a hydrogen peroxide solution. An ultrathin silicon oxide film having a similar effect to that of the chemical oxide film also can be formed by ultraviolet (UV) irradiation in an atmosphere containing oxygen although it is not an exact chemical oxide film (FIG. 4B).

When the hydrogen ion ratio is low in an ion doping apparatus used in the channel doping step, it is also considered as the pretreatment for channel doping that unsaturated bonds present at the surface of the amorphous silicon film 203 are made to terminate with an element to be bonded with bonding energy higher than that (71.5 kcal/mol) of Si—H bonds such as oxygen.

Next, a resist pattern 205 to serve as a mask for channel doping is formed with using the region corresponding to the n-channel type TFT of the amorphous silicon film 203 as its opening region. Afterward, using the ion doping apparatus, the region corresponding to the n-channel type TFT of the amorphous silicon film 203 is doped with a boron element as a p-type impurity with the resist pattern 205 used as a mask, and thus channel doping is implemented. In the channel doping, an ion source obtained through dilution of diborane ($B_2H_6$) gas with hydrogen is used. Generally, the channel doping is carried out under the doping conditions including a diborane dilution ratio of 0.01 to 1.0%, an accelerating voltage of 1 to 50 kV, an ion current of 10 to 500 nA, and a dose of $1\times10^{11}$ to $1\times10^{14}$ atoms/cm². In the present embodiment mode, the doping process was carried out under the channel doping conditions including a diborane dilution ratio of 0.1%, an accelerating voltage of 15 kV, an ion current of 50 nA, and a dose of $4\times10^{13}$ atoms/cm² (see FIG. 4B).

Next, the resist pattern 205 that has served as a mask for channel doping is removed. Afterward, washing is carried out by a treatment using dilute hydrofluoric acid to clean the surface of the amorphous silicon film 203. Afterward, a chemical oxide film 206 made of an ultrathin silicon oxide film is formed on the surface of the amorphous silicon film 203 by an ozone water treatment carried out for a predetermined time. This chemical oxide film 206 is formed for the purpose of improving wettability with respect to a Ni aqueous solution as a catalytic element solution to be applied later by a spin coating method. Note that in the present embodiment mode, the chemical oxide film 206 is formed by the ozone water treatment but may be formed by a treatment using a hydrogen peroxide solution (see FIG. 4C).

Next, the Ni aqueous solution as a catalytic element solution is applied to the whole surface of the amorphous silicon film 203 (strictly speaking, the chemical oxide film 206) by the spin coating method. Preferable Ni concentration of the Ni aqueous solution is in the range of 0.1 to 50 ppm by weight, more preferably about 1 to 30 ppm by weight. In the present embodiment mode, a Ni aqueous solution with a Ni concentration of 10 ppm by weight was applied by the spin coating method. In the spin coating, the substrate is rotated and an excess of the Ni aqueous solution is blown off to be removed, and thus an ultrathin Ni-containing film 207 is formed over the whole surface of the amorphous silicon film 203 (strictly speaking, the chemical oxide film 206) (see FIG. 4C).

Next, the amorphous silicon film 203 is heat-treated in a nitrogen atmosphere using a special-purpose heat treating furnace. In this embodiment mode, since the amorphous silicon film 203 with a thickness of 50 nm is deposited by the plasma CVD method as in Embodiment mode 1, a heat treatment is conducted at 550 C for four hours to form a crystalline silicon film 208 by the longitudinal growth method. Afterward, in order to improve the crystallinity of the crystalline silicon film 208 thus obtained, laser irradiation is carried out with respect to the crystalline silicon film 208. By this laser irradiation, the crystallinity of the crystalline silicon film 208 is improved considerably. In this embodiment mode, a pulse oscillation type KrF excimer laser (with a wavelength of 248 nm) is applied. This eximer laser has not only an effect of improving the crystallinity of the crystalline silicon film 208 but also an effect of improving the efficiency of gettering by a gettering source since the Ni element is brought into a state where the Ni element can move very easily (see FIG. 4C).

Figure 4D:
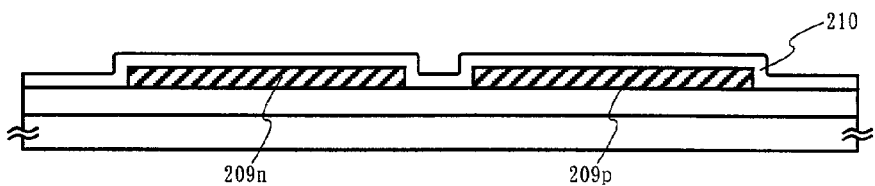
Figure 4E:
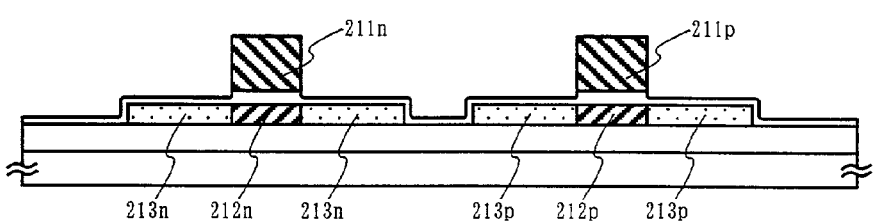

Next, pattern formation of the crystalline silicon film 208 is conducted by ordinary photolithography and dry etching to form a semiconductor film 209n corresponding to the n-channel type TFT and a semiconductor film 209p corresponding to a p-channel type TFT. Afterward, washing is carried out by a treatment using dilute hydrofluoric acid to clean the surfaces of the semiconductor films 209n and 209p. After the cleaning of the surfaces of the semiconductor films 209n and 209p, a gate insulating film 210 made of a silicon oxide film with a thickness of 100 nm is deposited by the plasma CVD method or the low pressure CVD method. Note that the TFT manufacturing steps carried out after this step are identical to those in Embodiment mode 1 and therefore their description is omitted (FIG. 4D).

Evaluation of Electric Characteristics of TFT

In accordance with the TFT manufacturing steps in Embodiment mode 2, n-channel type TFTs were manufactured actually as an experiment and their electric characteristics were evaluated. Here, the results of the evaluation of the electric characteristics are described.

Figure 5A:
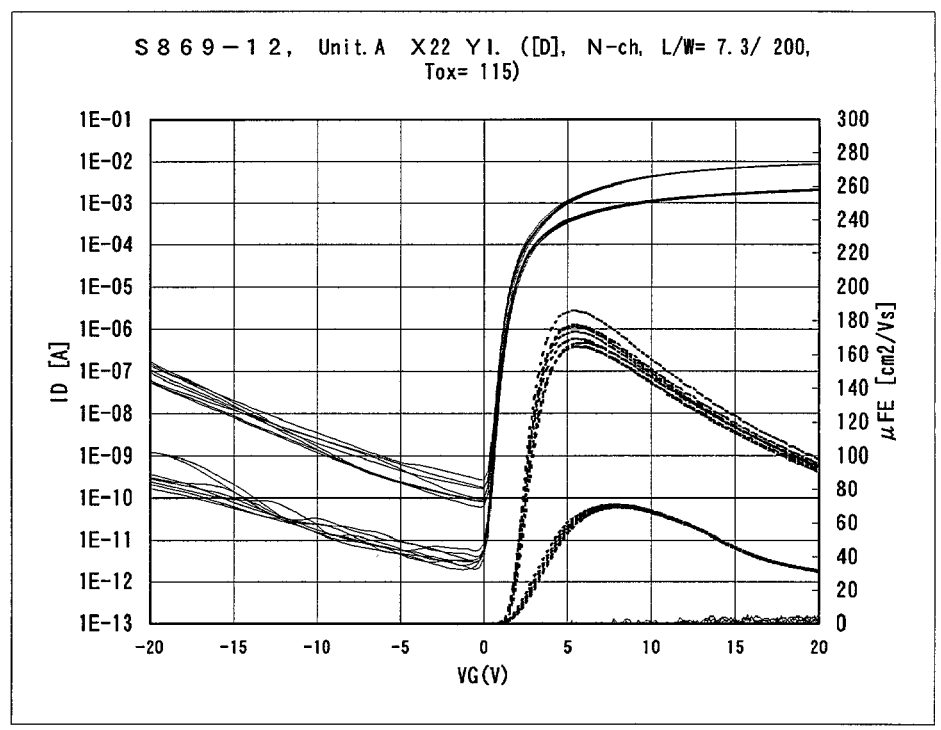
FIGS. 5A and 5B show data as to $I_D$-$V_G$ (current-voltage) characteristics of an n-channel type TFT.
Figure 5B:
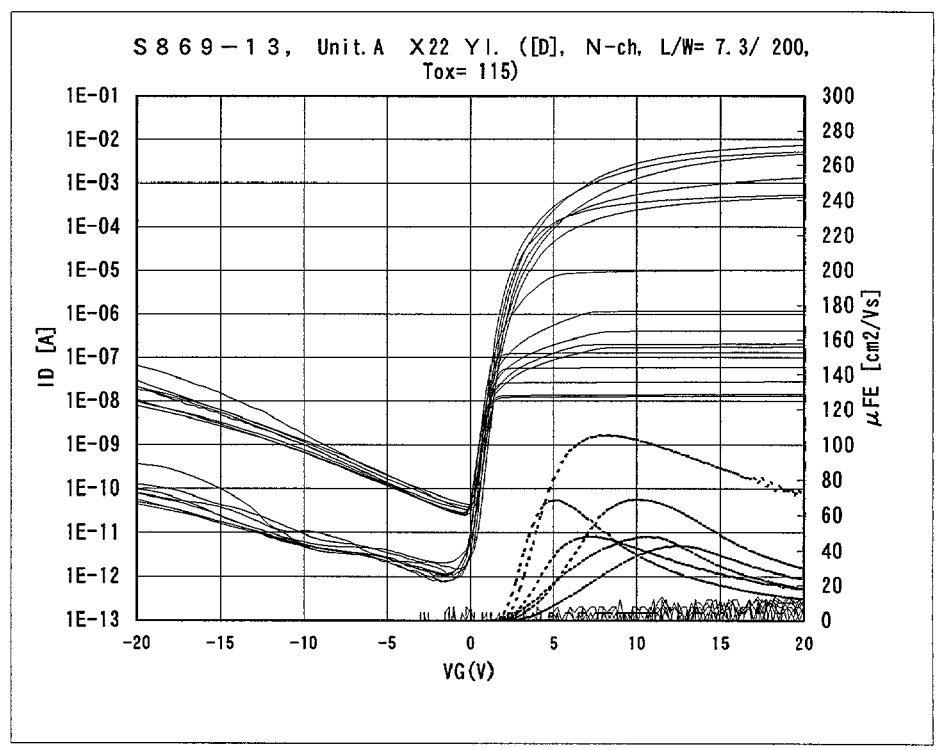

FIGS. 5A and 5B show data as to $I_D$-$V_G$ (current-voltage) characteristics of the n-channel type TFTs that were obtained through the measurements carried out with respect to eight n-channel type TFTs using a semiconductor measuring apparatus (4155B). FIG. 5A shows data obtained in the case where the step of forming a chemical oxide film made of an ultrathin silicon oxide film was employed and FIG. 5B shows data obtained in the case where the step of forming a chemical oxide film was omitted. Note that the channel length (L) and the channel width (W) of the n-channel type TFTs subjected to the measurement were 7.3 μm and 200 μm, respectively.

As can be seen from FIGS. 5A and 5B, the results were obtained that variations in $I_D$-$V_G$ characteristics among the n-channel type TFTs were small when the chemical oxide film was formed, while variations in $I_D$-$V_G$ characteristics among the n-channel type TFTs were great when no chemical oxide film was formed. It is considered as the cause of the variations in $I_D$-$V_G$ characteristics that the amorphous silicon film is etched with hydrogen ions during the channel doping and a reduction in thickness of the amorphous silicon film progresses to cause variations in contact resistance.

From the above-mentioned results of the evaluation of the $I_D$-$V_G$ characteristics, it has been proved that the chemical oxide film made of an ultrathin silicon oxide film has completely no problem in serving as a protective film for channel doping.

As described above, a TFT having excellent electric characteristics can be manufactured through application of the channel doping pretreatment step of forming a chemical oxide film and channel doping with respect to the amorphous silicon film.

Embodiments

Embodiment 1

The present embodiment is an example in which a channel doping pretreatment step of forming a chemical oxide film on an amorphous silicon film is applied to a step of manufacturing an active matrix type liquid crystal display and is described concretely with reference to FIGS. 6A to 10B. The description with respect to the step of crystallizing an amorphous silicon film after channel doping is directed to the case of crystallization using a catalytic element.

First, a silicon oxynitride film 302a with a thickness of 50 nm as the first layer and a silicon oxynitride film 302b with a thickness of 100 nm as the second layer that are different in composition ratio from each other are deposited on a glass substrate 301 by the plasma CVD method to form a base film 302. Examples of the glass substrate 301 used herein include quartz glass, barium borosilicate glass, aluminoborosilicate glass, and the like. Next, an amorphous silicon film 303a with a thickness of 55 nm is deposited on the base film 302 (302a and 302b) by the plasma CVD method. In depositing the amorphous silicon film 303a, an ultrathin natural oxide film (not shown) is attached to the surface of the amorphous silicon film 303a due to the effect of oxygen in the air mixed into the treating atmosphere. Note that in the present embodiment, the amorphous silicon film 303a is deposited by the plasma CVD method but may be formed by the low pressure CVD method (see FIG. 6A).

During the deposition of the amorphous silicon film 303a, there is a possibility that carbon, oxygen, and nitrogen present in the air may be mixed into the treating atmosphere. It has been known empirically that contamination by such impurity gases causes deterioration in characteristics of TFTs eventually obtained. In view of this, the present inventors et al. have recognized that the contamination by the impurity gases acts as a factor of crystallization inhibition. Hence, it is preferable to completely inhibit the impurity gases from being mixed into the treating atmosphere. Specifically, it is preferable to set the impurity gas concentration to be in the range of $5\times10^{17}$ atoms/cm$^3$ or less in both the cases of carbon and nitride and to be in the range of $1\times10^{18}$ atoms/cm$^3$ or less in the case of oxygen (see FIG. 6A).

Next, the natural oxide film (not shown) attached to the surface of the amorphous silicon film 303a is washed with dilute hydrofluoric acid, thereby cleaning the surface of the amorphous silicon film 303a. Afterward, as a pretreatment for channel doping, an ozone water treatment is carried out for a predetermined time to form a chemical oxide film 304 made of an ultrathin silicon oxide film with a thickness of 5 nm or less on the surface of the amorphous silicon film 303a. In the present embodiment, the chemical oxide film 304 is formed by the ozone water treatment but may be formed by a treatment with a hydrogen peroxide solution. Alternatively, an ultrathin silicon oxide film having a similar effect to that of the chemical oxide film can be formed by ultraviolet (UV) irradiation in an atmosphere containing oxygen although it is not an exact chemical oxide film (FIG. 6A).

When the hydrogen ion ratio is low in an ion doping apparatus used in the channel doping step, it is also considered as the pretreatment for channel doping that unsaturated bonds present at the amorphous silicon film 303a surface are made to terminate with an element to be bonded with bonding energy higher than that (71.5 kcal/mol) of Si—H bonds such as oxygen.

Next, a resist pattern including resist pattern portions 305 to 308 to serve as a mask for channel doping is formed with using as its opening regions the regions corresponding to n-channel type TFTs 401 and 403 and a pixel TFT 404 of the amorphous silicon film 303a. Afterward, using the ion doping apparatus, doping with a boron element as a p-type impurity is carried out with the resist pattern portions 305 to 308 used as a mask, and thus channel doping is implemented as a first ion doping process. In the channel doping, an ion source is used that is obtained through dilution of diborane ($B_2H_6$) gas with hydrogen. Generally, the channel doping is carried out under the doping conditions including a diborane dilution ratio of 0.01 to 1.0%, an accelerating voltage of 1 to 50 kV, an ion current of 10 to 500 nA, and a dose of $1\times10^{11}$ to $1\times10^{14}$ atoms/cm$^2$. In the present embodiment, the doping process was carried out under the channel doping conditions including a diborane dilution ratio of 0.1%, an accelerating voltage of 15 kV, an ion current of 50 nA, and a dose of $4\times10^{13}$ atoms/cm$^2$ (see FIG. 6A).

Next, the resist pattern portions 305 to 308 that have served as a mask for channel doping are removed. Afterward, washing is carried out by a treatment using dilute hydrofluoric acid to clean the surface of the amorphous silicon film 303a. Afterward, an ozone water treatment is carried out for a predetermined time to form a chemical oxide film (not shown) made of an ultrathin silicon oxide film on the surface of the amorphous silicon film 303a. This chemical oxide film (not shown) is formed for the purpose of improving wettability with respect to a Ni aqueous solution as a catalytic element solution to be applied later by a spin coating method. In the present example, the chemical oxide film (not shown) is formed by the ozone water treatment but may be formed by a treatment using a hydrogen peroxide solution (see FIG. 6B).

Next, a Ni aqueous solution as a catalytic element solution having an effect of accelerating crystallization is applied to the whole surface of the amorphous silicon film 303a. Specifically, nickel acetate as a Ni compound is dissolved in pure water and then a Ni aqueous solution whose concentration has been controlled to be 10 ppm by weight is applied by a spin process (see FIG. 6B).

Next, in order to control the amount of hydrogen contained in the amorphous silicon film 303a to 5 atom % or less, the substrate is heat-treated in a nitrogen atmosphere inside an electrothermal furnace at 450 C for one hour, thereby implementing dehydrogenation to remove the hydrogen contained in the amorphous silicon film 303a (see FIG. 6B).

Next, a heat treatment is carried out in the electrothermal furnace at 550 C for four hours to crystallize the amorphous silicon film 303a and thus a crystalline silicon film 303b is formed. Afterward, in order to improve the crystallinity of the crystalline silicon film 303b thus obtained, laser irradiation is carried out with respect to the crystalline silicon film 303b. By this laser irradiation, the crystallinity of the crystalline silicon film 303b is improved considerably. In the present embodiment, a pulse oscillation type KrF excimer laser (with a wavelength of 248 nm) is applied. This excimer laser has not only an effect of improving the crystallinity of the crystalline silicon film 303b but also an effect of improving the efficiency of gettering by a gettering source since the Ni element is brought into a state where the Ni element can move very easily (see FIG. 6B).

Next, pattern formation of the crystalline silicon film 303b is conducted by the ordinary photolithography and dry etching to form semiconductor films 309 to 313 to be channel, source, and drain regions of TFTs (see FIG. 7A).

Next, a gate insulating film 314 made of a silicon oxynitride film with a thickness of 100 nm is deposited by the plasma CVD method to cover the semiconductor films 309 to 313. In depositing the gate insulating film 314, washing is carried out by a treatment with dilute hydrofluoric acid to clean the surfaces of the semiconductor films 309 to 313. Afterward, a conductive film as a gate electrode material is deposited on the gate insulating film 314 by the sputtering method or the CVD method. As the gate electrode material used here, a heat resistant material is preferable that can withstand the heat treatment temperature (about 550 to 650 C) for gettering as a later step that also serves for activating the impurity elements. Examples of the heat resistant material include high melting metals such as Ta(tantalum), Mo(molybdenum), Ti(titanium), W(tungsten), Cr(chromium), and the like, metal silicide as a compound of a high melting metal and silicon, polycrystalline silicon having n-type or p-type conductivity, and the like. Note that in the present embodiment, a gate electrode film 315 formed from a W film with a thickness of 400 nm is deposited by the sputtering method (see FIG. 7B).

Above the substrate with the configuration described above are formed gate electrodes 322 to 325, an electrode 326 for storage capacitance, and an electrode 327 to function as a source wiring through the implementation of photolithography and dry etching for the formation of gate electrodes. After the dry etching, resist patterns 316 to 319 as a mask for the dry etching remain on the gate electrodes 322 to 325. Similarly, resist patterns 320 and 321 remain on the electrode 326 for storage capacitance and the electrode 327 to function as a source wiring, respectively. Note that the dry etching proceeds, the gate insulating film 314 made of the silicon oxynitride film as a base is reduced in thickness to be deformed into a shape of a gate insulating film 328 (see FIG. 8A).

Figures 8A, 8B:
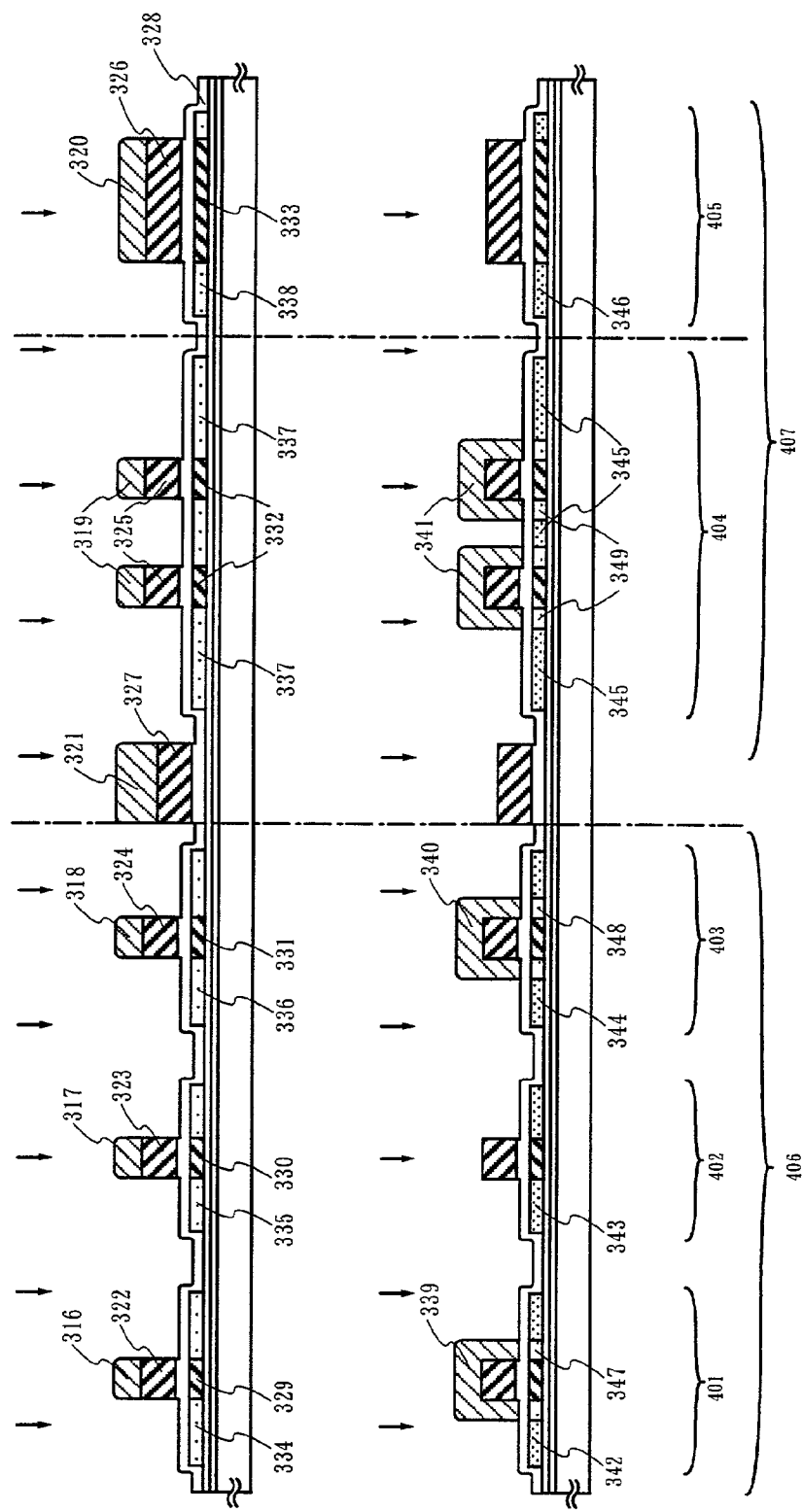
FIGS. 8A and 8B are cross-sectional views showing steps of manufacturing the active matrix type liquid crystal display device.

Next, with the resist patterns 316 to 321 remaining, doping with a low concentration n-type impurity is carried out as a second ion doping process using the ion doping apparatus with the gate electrodes 322 to 325 and the electrode 326 for storage capacitance used as a mask. The ion doping process is carried out using a p element as an n-type impurity under the conditions including an accelerating voltage of 10 to 100 kV and a dose of $3\times10^{12}$ to $3\times10^{13}$ atoms/cm$^2$. By this second ion doping process, low concentration impurity regions (n$^-$ regions) 334 to 338 containing the n-type impurity are formed in the regions of the semiconductor films 309 to 313 corresponding to the regions located outside the respective gate electrodes 322 to 325 and the electrode 326 for storage capacitance. At the same time, substantially intrinsic regions 329 to 332 to function as channels of the TFTs are formed directly under the gate electrodes 322 to 325. In the semiconductor film 313 located directly under the electrode 326 for storage capacitance, an intrinsic region 333 to function as one of electrodes for capacitance formation is formed since the region is not the TFT formation region but is a region where the storage capacitance 405 is to be formed (FIG. 8A).

Next, the substrate is washed with a special-purpose peeling liquid and thus the resist patterns 316 to 321 that have served as a mask for dry etching are removed. After the removal, in order to allow the n-channel type TFTs 401 and 403 in a driving circuit 406 and the pixel TFT 404 in a pixel region 407 to have a lightly doped drain (LDD) structure, resist patterns 339 to 341 for the formation of n$^+$ regions to serve as a mask for a third ion doping process are formed to cover the gate electrodes 322, 324, and 325 that are present in the above-mentioned regions. Afterward, doping with a high-concentration n-type impurity is carried out as the third ion doping process. The ion doping process is carried out under the doping conditions including an accelerating voltage of 10 to 100 kV and a dose of $1\times10^{14}$ to $1\times10^{16}$ atoms/cm$^2$. In the present embodiment, the doping process was carried out under the conditions including an accelerating voltage of 80 kV and a dose of $1.7\times10^{15}$ atoms/cm$^2$. By this ion doping process, high-concentration impurity regions (n$^+$ regions) 342, 344, and 345 containing the n-type impurity are formed in the regions of the semiconductor films 309, 311, and 312 corresponding to the regions located outside the resist patterns 339 to 341. With the formation of the high-concentration impurity regions (n$^+$ regions) 342, 344, and 345, the low-concentration impurity regions (n$^-$ regions) 334, 336, and 337 that have already been formed are separated into the high-concentration impurity regions (n$^+$ regions) 342, 344, and 345 and the low-concentration impurity regions (n$^-$ regions) 347 to 349 and thus the source and drain regions to compose the LDD structure are formed (see FIG. 8B).

At this time, the region of the p-channel type TFT 402 of the driving circuit 406 and the region of the storage capacitance 405 in the pixel region 407 that are regions other than the regions where the LDD structures are formed are ion-doped with the gate electrode 323 and the electrode 326 for storage capacitance used as a mask, respectively. Hence, high-concentration impurity regions (n$^+$ regions) 343 containing the n-type impurity are formed in the regions of the semiconductor film 310 corresponding to the regions located outside the gate electrode 323, and high-concentration impurity regions (n$^+$ regions) 346 containing the n-type impurity are also formed in the regions of the semiconductor film 313 corresponding to the regions located outside the electrode 326 for storage capacitance (see FIG. 8B)

Next, by the ordinary photolithography, resist patterns 350 to 352 are formed with using as its opening regions the region of the semiconductor film 310 corresponding to the p-channel type TFT 402 and the region of the semiconductor film 313 corresponding to the storage capacitance 405. Afterward, with the resist patterns 350 to 352 used as a mask, doping with a high-concentration p-type impurity is carried out as a fourth ion doping process using the ion doping apparatus. By this ion doping process, a boron element as a p-type impurity is ion-implanted into the region of the semiconductor film 310 corresponding to the p-channel type TFT 402 with the gate electrode 323 used as a mask. As a result, high-concentration impurity regions (p$^+$ regions) 353 having p-type conductivity are formed in the regions of the semiconductor film 310 corresponding to the regions outside the gate electrode 323. The high-concentration impurity regions (p$^+$ regions) 353 have already been doped with the phosphorous element as an n-type impurity but are doped to contain a high concentration of boron element so that the dose of the boron element reaches $2.5\times10^{15}$ atoms/ cm². Thus, high-concentration impurity regions (p⁺ regions) 353 having p-type conductivity to function as source and drain regions are formed. Similarly in the region where the storage capacitance 405 is formed, high-concentration impurity regions (p⁺ regions) 354 having p-type conductivity are also formed in the regions of the semiconductor film 313 corresponding to the regions outside the electrode 326 for storage capacitance (see FIG. 9A).

Next, after the removal of the resist patterns 350 to 352, a first interlayer insulating film 355 made of a silicon oxynitride film with a thickness of 150 nm is deposited by the plasma CVD method. Afterward, for the thermal activation of the impurity ions (the phosphorous and boron element) with which the semiconductor films 309 to 313 have been doped, a heat treatment is carried out in an electrothermal furnace at 600 C for 12 hours. This heat treatment is carried out for the thermal activation of the impurity ions but also is intended to getter the Ni element present in the substantially intrinsic regions 329 to 332 to function as channel regions and the intrinsic region 333 to function as one of the electrodes for capacitance formation by the impurity ions. Note that the thermal activation may be carried out before the deposition of the first interlayer insulating film 355. However, when the wiring materials for the gate electrodes or the like have low heat resistance, it is preferable to carry out the thermal activation after the deposition of the first interlayer insulating film 355. Afterward, in order to terminate unsaturated bonds present in the semiconductor films 309 to 313, a hydrogen treatment is carried out in a 3% hydrogen-containing nitrogen atmosphere at 410 C for one hour (see FIG. 9B).

Next, a second interlayer insulating film 356 made from an acrylic resin film with a thickness of 1.6 μm is formed on the first interlayer insulating film 355. Afterward, contact holes are formed by the ordinary photolithography and dry etching so as to pass through the second interlayer insulating film 356, the first interlayer insulating film 355, and the gate insulating film 328 as an underlayer film. At this time, the contact holes are formed to be connected to the electrode 327 to function as a source wiring and the high-concentration impurity regions 342, 344, 345, 353, and 354 (see FIG. 10A).

Figures 10A, 10B:
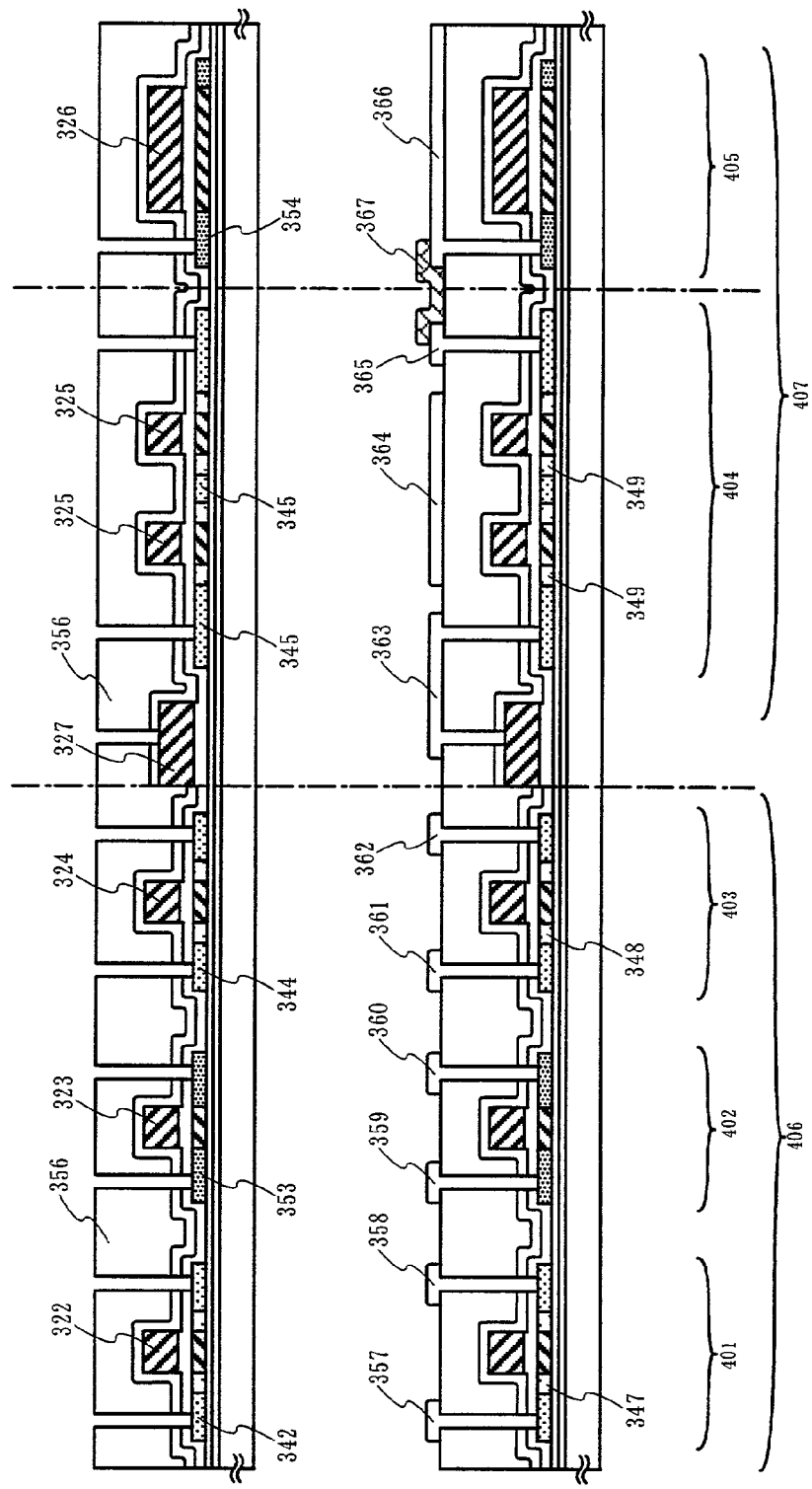
FIGS. 10A and 10B are cross-sectional views showing steps of manufacturing the active matrix type liquid crystal display device.

Next, conductive metal wirings 357 to 362 are formed to be electrically connected to the high-concentration impurity regions 342, 344, and 353 of the driving circuit 406. Connection electrodes 363, 365, and 366 and gate wiring 364 in the pixel region 407 are formed with the same conductive material. In the present embodiment, a laminated film composed of a Ti film with a thickness of 50 nm and an Al—Ti alloy film with a thickness of 500 nm is applied as a constituent material for the metal wirings 357 to 362, the connection electrodes 363, 365, and 366, and the gate wiring 364. The connection electrode 363 is formed so as to electrically connect the impurity region 345 with the electrode 327 to function as a source wiring. The connection electrode 365 is formed to be electrically connected to the impurity region 345 of the pixel TFT 404. The connection electrode 366 is formed to be electrically connected to the impurity region 354 of the storage capacitance 405. In addition, the gate wiring 364 is formed to electrically connect a plurality of gate electrodes 325 of the pixel TFT 404 to each other. Afterward, a transparent conductive film such as an indium tin oxide (ITO) film with a thickness of 80 to 120 nm is deposited and then a pixel electrode 367 is formed by photolithography and etching. The pixel electrode 367 is electrically connected to the impurity regions 345 as the source and drain regions of the pixel TFT 404 through the connection electrode 365 and is also electrically connected to the impurity region 354 of the storage capacitance 405 through the connection electrode 366 (FIG. 10B).

As described above, a channel doping pretreatment step of forming a chemical oxide film can be applied to the process of manufacturing an active matrix type liquid crystal display having n-channel type TFTs with the LDD structure and a p-channel type TFT with a single drain structure. Note that the application of the chemical oxide film to the channel doping pretreatment step is advantageous of an improvement in processing capability in the channel doping step and a reduction in production cost.

Embodiment 2

The present invention relates to a method of manufacturing a semiconductor device having a circuit structure with TFTs. The present invention can be applied to the manufacture of various active matrix type semiconductor displays, for example, a liquid crystal display and an EL display. Hence, the present invention can be applied to the manufacture of electronic equipment used in various fields having an active matrix type semiconductor display (a liquid crystal display or an EL display) installed therein. Here, concrete examples of such electronic equipment are described with reference to FIGS. 11A to 13C. Examples of such electronic equipment include a video camera, a digital camera, a projector (of a rear type or a front type), a head mounted display (a goggles-type display), game equipment, a car navigation system, a personal computer, a portable information terminal (a mobile computer, a portable telephone, an electronic book, or the like), and the like.

FIG. 11A shows a personal computer including a body 1001, an image input unit 1002, a display device 1003, and a keyboard 1004. The present invention can be applied to the display device 1003 and other circuits.

FIG. 11B shows a video camera including a body 1101, a display device 1102, a voice input unit 1103, operation switches 1104, a battery 1105, and an image receiving unit 1106. The present invention can be applied to the display device 1102 and other circuits.

FIG. 11C shows a mobile computer including a body 1201, a camera unit 1202 provided with an image receiving unit 1203 and an operation switch 1204, and a display device 1205. The present invention can be applied to the display device 1205 and other circuits.

FIG. 11D shows a goggles-type display device including a body 1301, display devices 1302, and arm units 1303. The present invention can be applied to the display devices 1302 and other circuits.

FIG. 11E shows a player for a recording medium containing programs recorded therein (hereinafter simply referred to as a "recording medium") that includes a body 1401, a display device 1402, speaker units 1403, a recording medium 1404, and operation switches 1405. In this device, a DVD, a CD, or the like is used as the recording medium. This device can be used for listening music, playing games, or internet. The present invention can be applied to the display device 1402 and other circuits.

FIG. 11F shows a portable telephone including a display panel 1501, an operation panel 1502, a joint unit 1503, a display unit 1504, a voice output unit 1505, operation keys 1506, a power switch 1507, a voice input unit 1508, and an antenna 1509. The display panel 1501 and the operation panel 1502 are joined with the joint unit 1503. The angle è between the plane in which the display unit 1504 of the display panel 1501 is disposed and the plane in which the operation keys 1506 of the control panel 1502 are arranged can be changed arbitrarily by the joint unit 1503. The present invention can be applied to the display unit 1504.

Figure 12A:
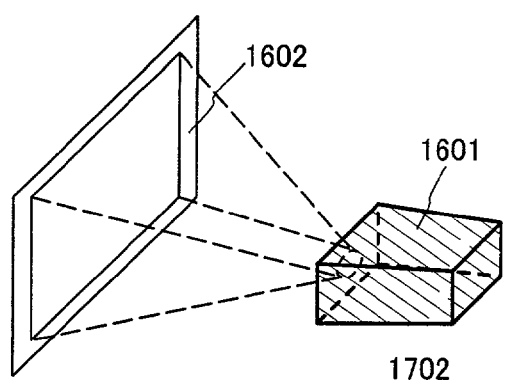
FIGS. 12A to 12D are schematic drawings showing devices as examples of electronic equipment with a semiconductor display device installed therein.

FIG. 12A shows a front type projector including a light source optical system and display device 1601 and a screen 1602. The present invention can be applied to the display device 1601 and other circuits.

Figure 12B:
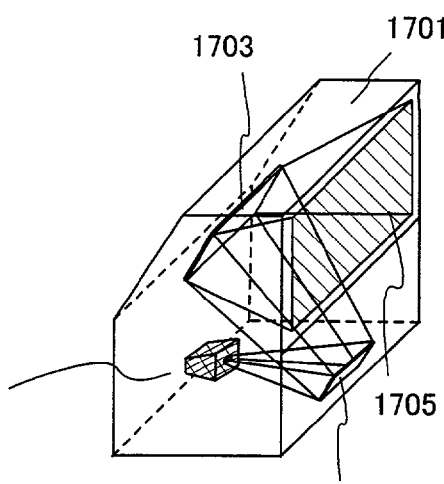

FIG. 12B shows a rear type projector including a body 1701, a light source optical system and display device 1702, mirrors 1703 and 1704, and a screen 1705. The present invention can be applied to the display device 1702 and other circuits.

Figure 12C:
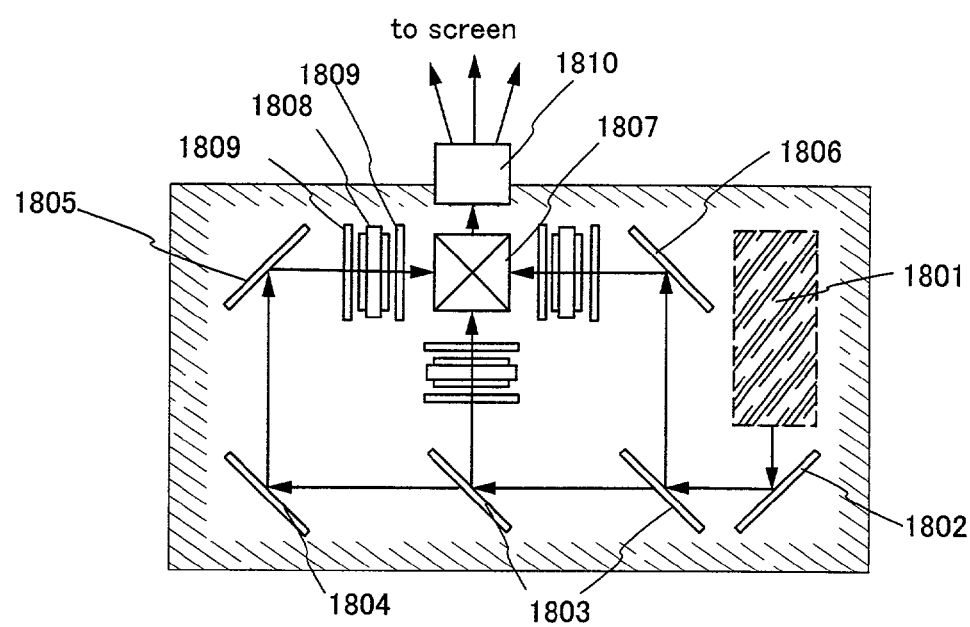

Note that FIG. 12C is a diagram showing an example of the configuration of the light source optical system and display device 1601 shown in FIG. 12A and the light source optical system and display device 1702 shown in FIG. 12B. The light source optical systems and display devices 1601 and 1702 each include a light source optical system 1801, mirrors 1802 and 1804 to 1806, dichroic mirrors 1803, an optical system 1807, display devices 1808, phase difference plates 1809, and a projection optical system 1810. The projection optical system 1810 has a configuration including a plurality of optical lenses with a projection lens. This configuration is called a three-plate type since three display devices 1808 are used therein. In the optical path indicated with arrows shown in FIG. 12C, an operator may suitably provide an optical lens and a film having a polarization function, a film for phase difference adjustment, an IR film, or the like.

Figure 12D:
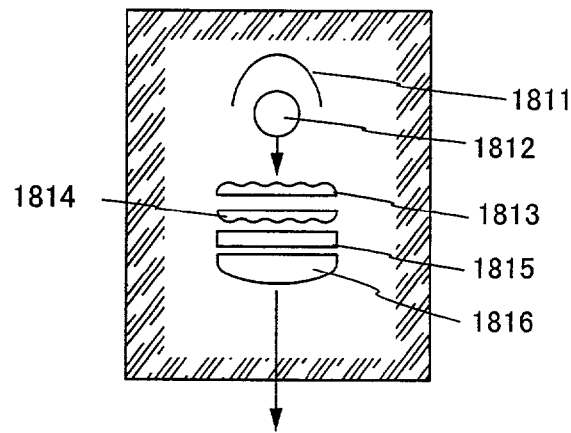

FIG. 12D is a diagram showing an example of the configuration of the light source optical system 1801 shown in FIG. 12C. In the present embodiment, the light source optical system 1801 includes a reflector 1811, a light source 1812, lens arrays 1813 and 1814, a light polarizing/transforming device 1815, and a condenser lens 1816. Note that the light source optical system shown in FIG. 12D is an example and the configuration of the light source optical system is not limited to this. For instance, an operator may suitably provide the light source optical system with an optical lens and a film having a polarization function, a film for adjusting phase difference, an IR film, or the like.

Figure 13A:
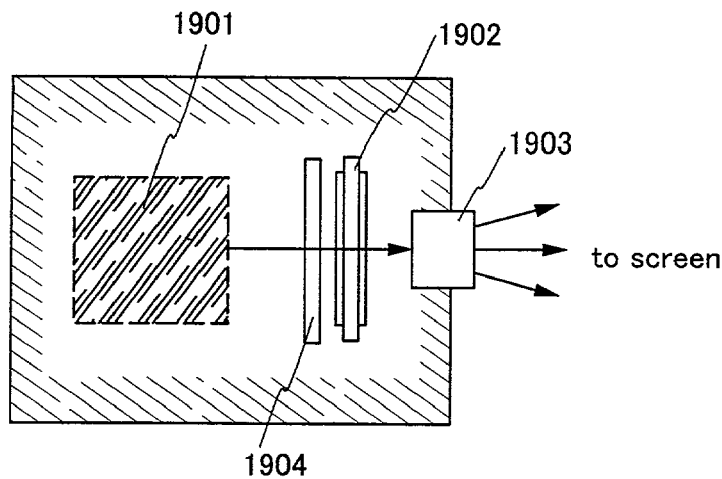
FIGS. 13A to 13C are schematic drawings showing devices as examples of electronic equipment with a semiconductor display device installed therein.

FIG. 13A shows an example of a single-plate type. The light source optical system and display device shown in FIG. 13A include a light source optical system 1901, a display device 1902, a projection optical system 1903, and a phase difference plate 1904. The projection optical system 1903 includes a plurality of optical lenses with a projection lens. The light source optical system and display device shown in FIG. 13A can be applied to the light source optical systems and display devices 1601 and 1702 shown in FIGS. 12A and 12B. The light source optical system shown in FIG. 12D may be used as the light source optical system 1901. In addition, the display device 1902 is provided with a color filter (not shown), thereby coloring display images.

Figure 13B:
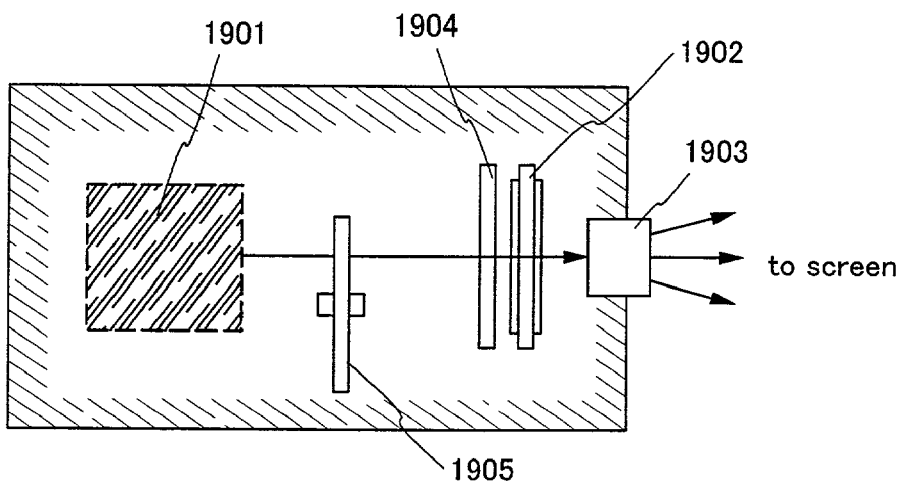

A light source optical system and display device shown in FIG. 13B is an application example of FIG. 13A and display images are colored using an RGB rotary color filter disc 1905 instead of being provided with a color filter. The light source optical system and display device shown in FIG. 13B can be applied to the light source optical systems and display devices 1601 and 1702 shown in FIGS. 12A and 12B, respectively.

Figure 13C:
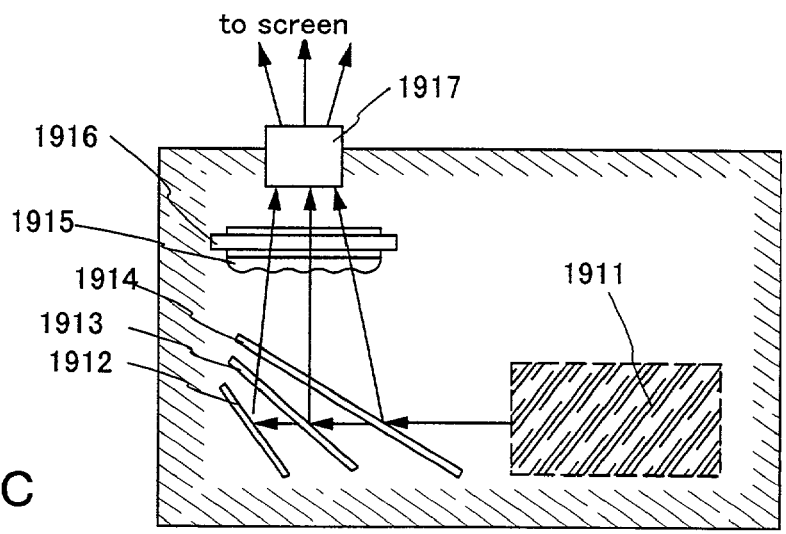

A light source optical system and display device shown in FIG. 13C is called a color-filterless single-plate type. In this system, a display device 1916 is provided with a microlens array 1915, and display images are colored using a dichroic mirror (green) 1912, a dichroic mirror (red) 1913, and a dichroic mirror (blue) 1914. A projection optical system 1917 includes a plurality of optical lenses with a projection lens. The light source optical system and display device shown in FIG. 13C can be applied to the light source optical systems and display devices 1601 and 1702 shown in FIGS. 12A and 12B, respectively. An optical system with a coupling lens and a collimator lens in addition to the light source may be used as a light source optical system 1911.

As described above, the method of manufacturing a semiconductor device of the present invention finds a very wide range of application. The present invention can be applied to electronic equipment used in variety of fields with an active matrix type liquid crystal display device and an EL display device installed therein.

The present invention relates to a method of manufacturing a semiconductor device having a circuit structure with TFTs and more specifically to a pretreatment for doping a silicon-based semiconductor film such as a TFT active layer with impurity ions. The present invention has the following effects.

Effect 1

The present invention employs a simple pretreatment step of forming a chemical oxide film or the like as a pretreatment in an ion doping step and thus is effective in improving the throughput of the whole ion doping step.

Effect 2

Since an expensive plasma CVD apparatus or low pressure CVD apparatus is no longer necessary for the pretreatment in the ion doping step, the present invention is effective in reducing production cost.

The invention may be embodied in other forms without departing from the spirit or essential characteristics thereof. The embodiment modes disclosed in this application are to be considered in all respects as illustrative and not limiting. The scope of the invention is indicated by the appended claims rather than by the foregoing description, and all changes which come within the meaning and range of equivalency of the claims are intended to be embraced therein.

TABLE 1

Experimental conditions of channel doping with respect to the silicon-cotaining amorphous semiconductor film

| substrate No. | chemical oxide film | diborane dilution ratio |
| --- | --- | --- |
| 1 | None | 0.1% $B_2H_6/H_2$ |
| 2 | Exist | 0.1% $B_2H_6/H_2$ |
| 3 | None | 1.0% $B_2H_6/H_2$ |
| 4 | Exist | 1.0% $B_2H_6/H_2$ |

What is claimed is:

1. A method of manufacturing a semiconductor device comprising the steps of:

forming a semiconductor film comprising silicon over an insulating substrate;

crystallizing the semiconductor film comprising silicon;

forming a chemical oxide film on a surface of the crystallized semiconductor film comprising silicon by using a liquid chemical;

doping the crystallized semiconductor film comprising silicon with impurity ions through the chemical oxide film; and forming at least one channel region comprising a portion of the doped semiconductor film.

2. A method of manufacturing a semiconductor device according to claim 1, wherein the semiconductor film comprising silicon is an amorphous semiconductor film comprising silicon.

3. A method of manufacturing a semiconductor device according to claim 1, wherein an amorphous semiconductor film comprising silicon is deposited as the semiconductor film comprising silicon, and a heat treatment is conducted to form a polycrystalline semiconductor film comprising silicon.

4. A method of manufacturing a semiconductor device according to claim 1, wherein an amorphous semiconductor film comprising silicon is deposited as the semiconductor film comprising silicon, a catalytic element having an effect of accelerating crystallization is applied to the silicon-containing amorphous semiconductor film, and a heat treatment is conducted to form a silicon-containing crystalline semiconductor film.

5. A method of manufacturing a semiconductor device according to claim 4, wherein at least one element selected from the group consisting of Fe, Co, Ni, Ru, Rh, Pd, Os, Ir, Pt, Cu, and Au is added as the catalytic element.

6. A method of manufacturing a semiconductor device according to claim 1, wherein a material including hydrogen is used as an ion source for the impurity ions used in the doping step.

7. A method of manufacturing a semiconductor device according to claim 1, wherein the doping step allows channel doping to be implemented.

8. A method of manufacturing a semiconductor device according to claim 1, wherein the chemical oxide film is formed by a treatment with ozone water.

9. A method of manufacturing a semiconductor device according to claim 1, wherein the chemical oxide film is formed by a treatment with a hydrogen peroxide solution.

10. A method of manufacturing a semiconductor device according to claim 1, wherein the semiconductor device is at least one device selected from the group consisting of a personal computer, a video camera, a mobile computer, a goggle type display device, a DVD player, a CD player, a portable telephone, a front type projector and a rear type projector.

11. A method of manufacturing a semiconductor device according to claim 1, wherein the chemical oxide film is 5 nm thick or less.

12. A method of manufacturing a semiconductor device comprising the steps of:
forming a semiconductor film comprising silicon over an insulating substrate;
crystallizing the semiconductor film comprising silicon;
terminating dangling bonds on a surface of the crystallized semiconductor film comprising silicon with oxygen to prevent the semiconductor film from being etched by a subsequent doping step;
doping the crystallized semiconductor film comprising silicon with impurity ions after terminating dangling bonds on a surface of the crystallized semiconductor film; and
forming at least one channel region comprising a portion of the doped semiconductor film.

13. A method of manufacturing a semiconductor device according to claim 12, wherein the semiconductor film comprising silicon is an amorphous semiconductor film comprising silicon.

14. A method of manufacturing a semiconductor device according to claim 12, wherein an amorphous semiconductor film comprising silicon is deposited as the semiconductor film comprising silicon, and a heat treatment is conducted to form a polycrystalline semiconductor film comprising silicon.

15. A method of manufacturing a semiconductor device according to claim 12, wherein an amorphous semiconductor film comprising silicon is deposited as the semiconductor film comprising silicon, a catalytic element having an effect of accelerating crystallization is applied to the amorphous semiconductor film comprising silicon, and a heat treatment is conducted to form a crystalline semiconductor film comprising silicon.

16. A method of manufacturing a semiconductor device according to claim 12, wherein a material including hydrogen is used as an ion source for the impurity ions used in the doping step.

17. A method of manufacturing a semiconductor device according to claim 12, wherein the doping step allows channel doping to be implemented.

18. A method of manufacturing a semiconductor device according to claim 12, wherein the semiconductor device is at least one device selected from the group consisting of a personal computer, a video camera, a mobile computer, a goggle type display device, a DVD player, a CD player, a portable telephone, a front type projector and a rear type projector.

19. A method of manufacturing a semiconductor device comprising the steps of:
forming a semiconductor film comprising silicon over an insulating substrate;
crystallizing the semiconductor film comprising silicon;
terminating dangling bonds on a surface of the crystallized semiconductor film comprising silicon with an element to be bonded with bonding energy higher than that of Si—H bonds to prevent the semiconductor film from being etched by a subsequent doping step;
doping the crystallized semiconductor film comprising silicon with impurity ions after terminating dangling bonds on a surface of the crystallized semiconductor film; and
forming at least one channel region comprising a portion of the doped semiconductor film.

20. A method of manufacturing a semiconductor device according to claim 19, wherein the semiconductor film comprising silicon is an amorphous semiconductor film comprising silicon.

21. A method of manufacturing a semiconductor device according to claim 19, wherein an amorphous semiconductor film comprising silicon is deposited as the semiconductor film comprising silicon, and a heat treatment is conducted to form a polycrystalline semiconductor film comprising silicon.

22. A method of manufacturing a semiconductor device according to claim 19, wherein an amorphous semiconductor film comprising silicon is deposited as the semiconductor film comprising silicon, a catalytic element having an effect of accelerating crystallization is applied to the amorphous semiconductor film comprising silicon, and a heat treatment is conducted to form a crystalline semiconductor film comprising silicon.

23. A method of manufacturing a semiconductor device according to claim 19, wherein a material including hydrogen is used as an ion source for the impurity ions used in the doping step.

24. A method of manufacturing a semiconductor device according to claim 19, wherein the doping step allows channel doping to be implemented.

25. A method of manufacturing a semiconductor device according to claim 19, wherein the semiconductor device is at least one device selected from the group consisting of a personal computer, a video camera, a mobile computer, a goggle type display device, a DVD player, a CD player, a portable telephone, a front type projector and a rear type projector.

26. A method of manufacturing a semiconductor device comprising the steps of:
forming a semiconductor film comprising silicon over an insulating substrate;
crystallizing the semiconductor film comprising silicon;
forming a chemical oxide film on a surface of the crystallized semiconductor film comprising silicon by using a liquid chemical;
doping the crystallized semiconductor film comprising silicon with impurity ions through the chemical oxide film;
patterning the semiconductor film to form at least one active layer after doping;
forming a gate insulating film over the active layer after patterning the semiconductor film; and
forming a gate electrode over the semiconductor film with the gate insulating film interposed therebetween,
wherein the chemical oxide film is formed by a treatment with at least one material selected from the group of: ozone water and a hydrogen peroxide solution.

27. A method of manufacturing a semiconductor device according to claim 26, wherein the semiconductor device is at least one device selected from the group consisting of a personal computer, a video camera, a mobile computer, a goggle type display device, a DVD player, a CD player, a portable telephone, a front type projector and a rear type projector.

28. A method of manufacturing a semiconductor device according to claim 26, wherein the chemical oxide film is 5 nm thick or less.

29. A method of manufacturing a semiconductor device comprising the steps of:
forming a semiconductor film comprising silicon over an insulating substrate;
crystallizing the semiconductor film comprising silicon;
forming a chemical oxide film on a surface of the crystallized semiconductor film comprising silicon by using a liquid chemical;
doping the crystallized semiconductor film comprising silicon with impurity ions through the chemical oxide film;
forming a gate insulating film over the semiconductor film after doping; and
forming a gate electrode over the gate insulating film.

30. A method of manufacturing a semiconductor device according to claim 29, wherein, in the doping step, a material gas is at least one selected from the group consisting of diborane, phosphine, arsine and those obtained through dilution thereof with hydrogen.

31. A method of manufacturing a semiconductor device according to claim 29, wherein the semiconductor device is at least one device selected from the group consisting of a personal computer, a video camera, a mobile computer, a goggle type display device, a DVD player, a CD player, a portable telephone, a front type projector and a rear type projector.

32. A method of manufacturing a semiconductor device according to claim 29, wherein the chemical oxide film is 5 nm thick or less.

33. A method of manufacturing a semiconductor device comprising the steps of:
forming a semiconductor film comprising silicon over an insulating substrate;
crystallizing the semiconductor film comprising silicon;
terminating dangling bonds on a surface of the crystallized semiconductor film comprising silicon with oxygen to prevent the semiconductor film from being etched by a subsequent doping step;
doping the crystallized semiconductor film comprising silicon with impurity ions after terminating dangling bonds;
forming a gate insulating film over the semiconductor film after doping; and
forming a gate electrode over the gate insulating film.

34. A method of manufacturing a semiconductor device according to claim 33, wherein, in the doping step, a material gas is at least one selected from the group consisting of diborane, phosphine, arsine and those obtained through dilution thereof with hydrogen.

35. A method of manufacturing a semiconductor device according to claim 33, wherein the semiconductor device is at least one device selected from the group consisting of a personal computer, a video camera, a mobile computer, a goggle type display device, a DVD player, a CD player, a portable telephone, a front type projector and a rear type projector.

36. A method of manufacturing a semiconductor device comprising the steps of:
forming a semiconductor film comprising silicon over an insulating substrate;
crystallizing the semiconductor film comprising silicon;
terminating dangling bonds on a surface of the crystallized semiconductor film comprising silicon with an element to be bonded with bonding energy higher than that of Si—H bonds to prevent the semiconductor film from being etched by a subsequent doping step;
doping the crystallized semiconductor film comprising silicon with impurity ions after terminating dangling bonds;
forming a gate insulating film over the semiconductor film after doping; and
forming a gate electrode over the gate insulating film.

37. A method of manufacturing a semiconductor device according to claim 36, wherein, in the doping step, a material gas is at least one selected from the group consisting of diborane, phosphine, arsine and those obtained through dilution thereof with hydrogen.

38. A method of manufacturing a semiconductor device according to claim 36, wherein the semiconductor device is at least one device selected from the group consisting of a personal computer, a video camera, a mobile computer, a goggle type display device, a DVD player, a CD player, a portable telephone, a front type projector and a rear type projector.

* * * * *